United States Patent
Hwang et al.

(10) Patent No.: US 9,306,041 B2
(45) Date of Patent: Apr. 5, 2016

(54) VERTICAL TYPE SEMICONDUCTOR DEVICES

(71) Applicants: Sung-Min Hwang, Seoul (KR); Han-Soo Kim, Suwon-si (KR); Woon-Kyung Lee, Seongnam-si (KR); Won-Seok Cho, Suwon-si (KR)

(72) Inventors: Sung-Min Hwang, Seoul (KR); Han-Soo Kim, Suwon-si (KR); Woon-Kyung Lee, Seongnam-si (KR); Won-Seok Cho, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 35 days.

(21) Appl. No.: 14/156,607

(22) Filed: Jan. 16, 2014

(65) Prior Publication Data

US 2014/0197481 A1 Jul. 17, 2014

(30) Foreign Application Priority Data

Jan. 17, 2013 (KR) .......................... 10-2013-0005325

(51) Int. Cl.
*H01L 29/66* (2006.01)
*H01L 29/792* (2006.01)
*H01L 27/115* (2006.01)

(52) U.S. Cl.
CPC .... *H01L 29/66833* (2013.01); *H01L 27/11575* (2013.01); *H01L 27/11582* (2013.01); *H01L 29/7926* (2013.01)

(58) Field of Classification Search
CPC ................. H01L 27/11582; H01L 27/11578; H01L 27/11575; H01L 29/7926; H01L 29/66833; H01L 29/792
See application file for complete search history.

(56) References Cited

U.S. PATENT DOCUMENTS

| 7,906,818 | B2 | 3/2011 | Pekny | |
|---|---|---|---|---|
| 2010/0097859 | A1* | 4/2010 | Shim | G11C 5/02 365/185.05 |
| 2010/0200906 | A1 | 8/2010 | Kidoh et al. | |
| 2010/0202206 | A1 | 8/2010 | Seol et al. | |
| 2011/0031547 | A1 | 2/2011 | Watanabe | |
| 2011/0057250 | A1 | 3/2011 | Higashi | |
| 2011/0065270 | A1 | 3/2011 | Shim et al. | |
| 2011/0143524 | A1* | 6/2011 | Son | H01L 27/11548 438/479 |
| 2011/0147801 | A1* | 6/2011 | Shim | H01L 27/11551 257/211 |
| 2011/0309432 | A1 | 12/2011 | Ishihara et al. | |
| 2011/0316072 | A1* | 12/2011 | Lee | H01L 27/11551 257/329 |
| 2012/0012921 | A1 | 1/2012 | Liu | |
| 2012/0032245 | A1 | 2/2012 | Hwang et al. | |
| 2012/0119283 | A1* | 5/2012 | Lee | H01L 27/11519 257/316 |
| 2012/0201080 | A1* | 8/2012 | Kang | G11C 16/0483 365/185.11 |
| 2013/0334585 | A1* | 12/2013 | Lee | H01L 27/11582 257/315 |
| 2014/0043915 | A1* | 2/2014 | Choi | G11C 16/10 365/185.25 |
| 2015/0137216 | A1* | 5/2015 | Lee | H01L 27/11582 257/329 |

* cited by examiner

*Primary Examiner* — Victor A Mandala
(74) *Attorney, Agent, or Firm* — Lee & Morse, P.C.

(57) ABSTRACT

A vertical type semiconductor device includes first and second word line structures that include first and second word lines. The word lines surround a plurality of pillar structures, which are provided to connect the word lines to corresponding string select lines. Connecting patterns electrically connect pairs of adjacent first and second word lines in a same plane. The device may be a nonvolatile memory device or a different type of device.

20 Claims, 31 Drawing Sheets

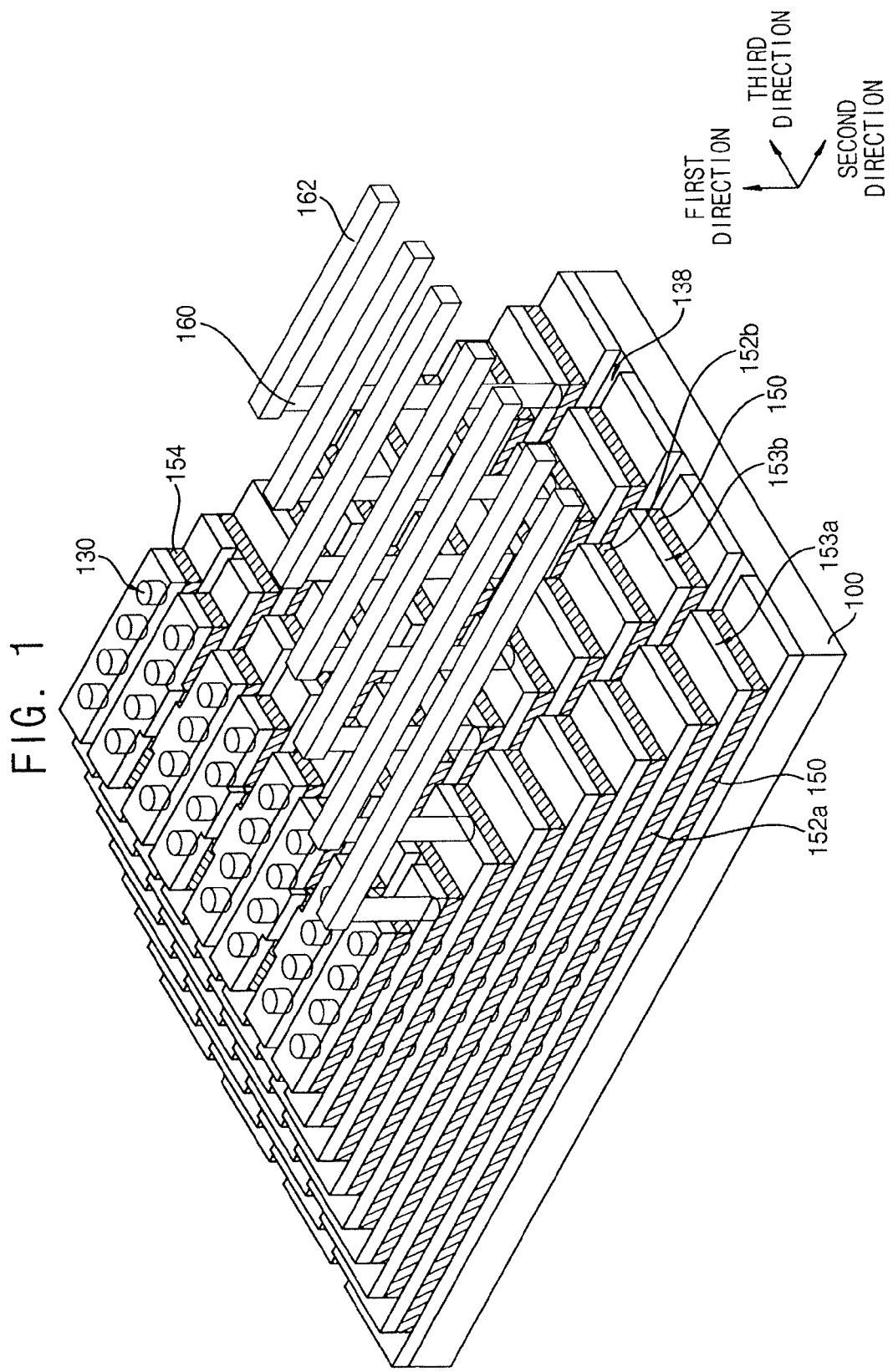

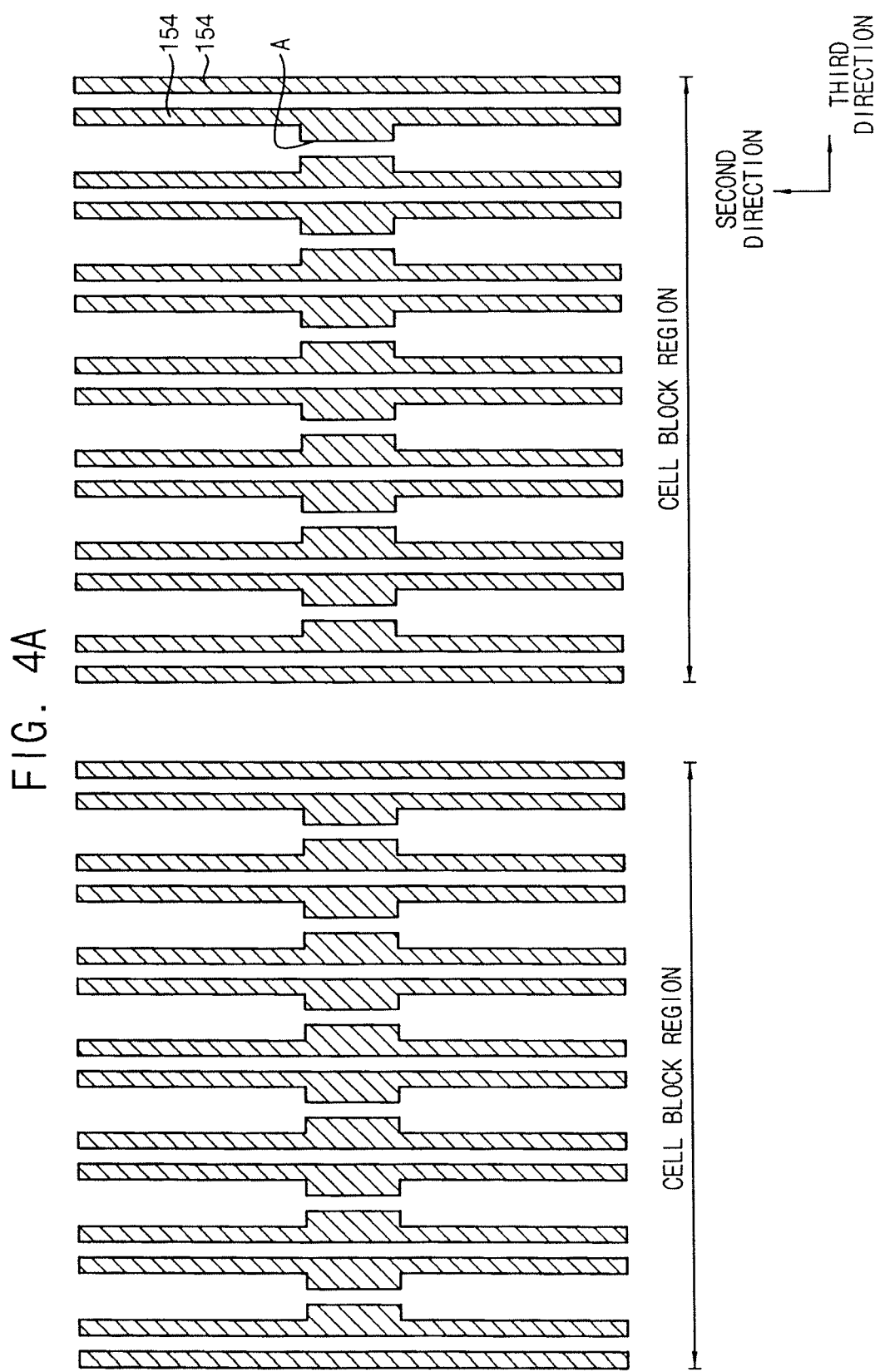

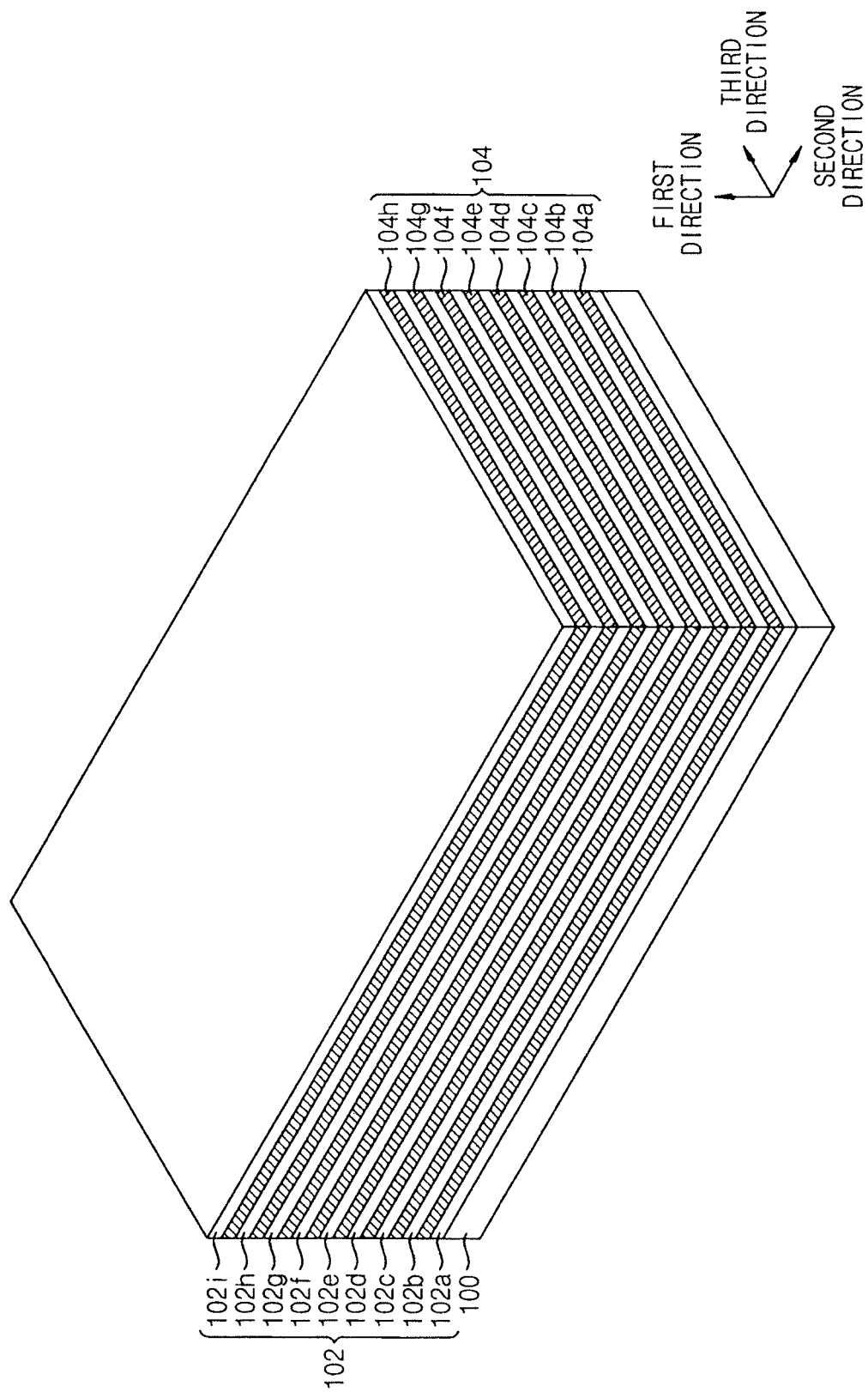

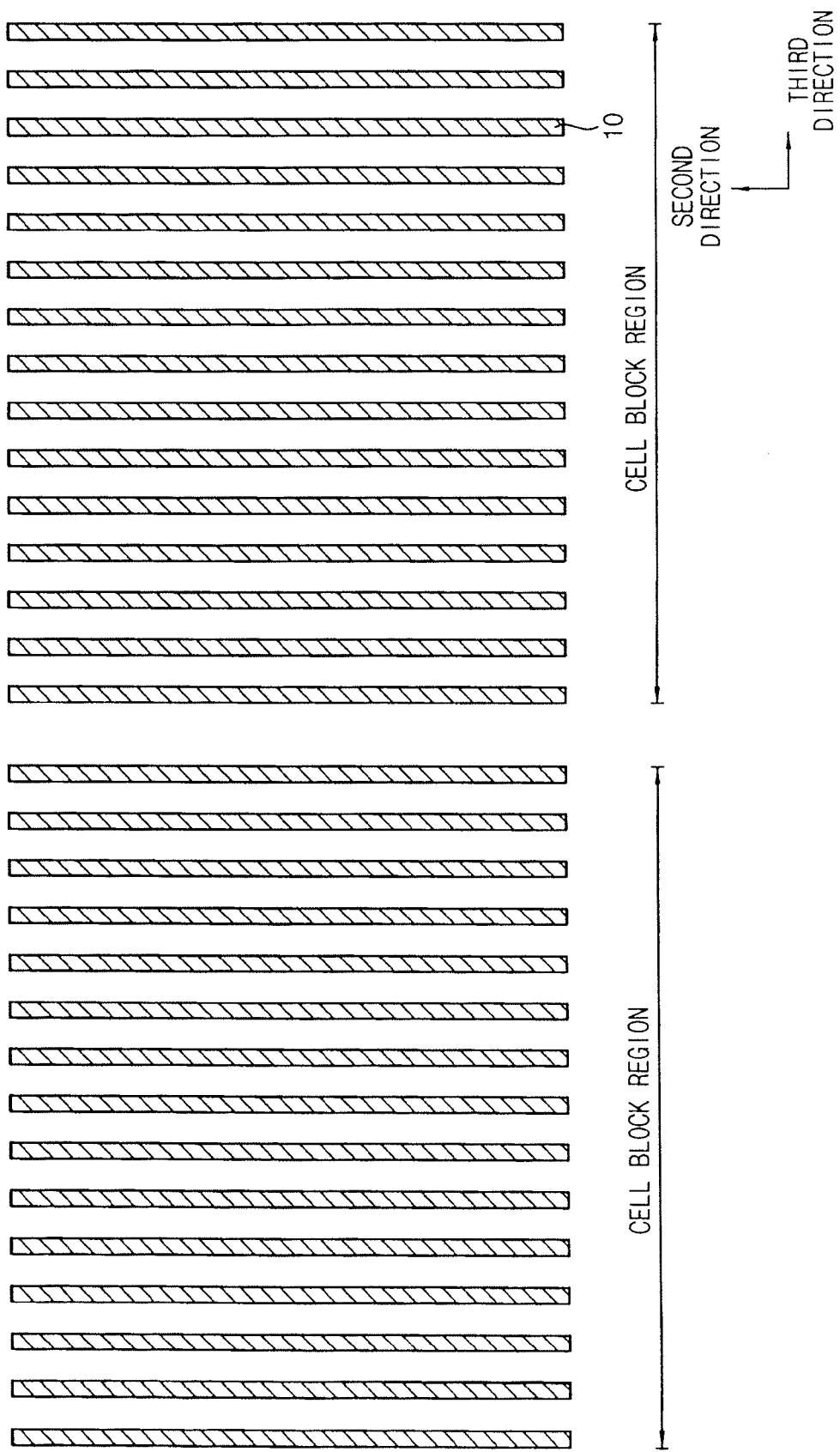

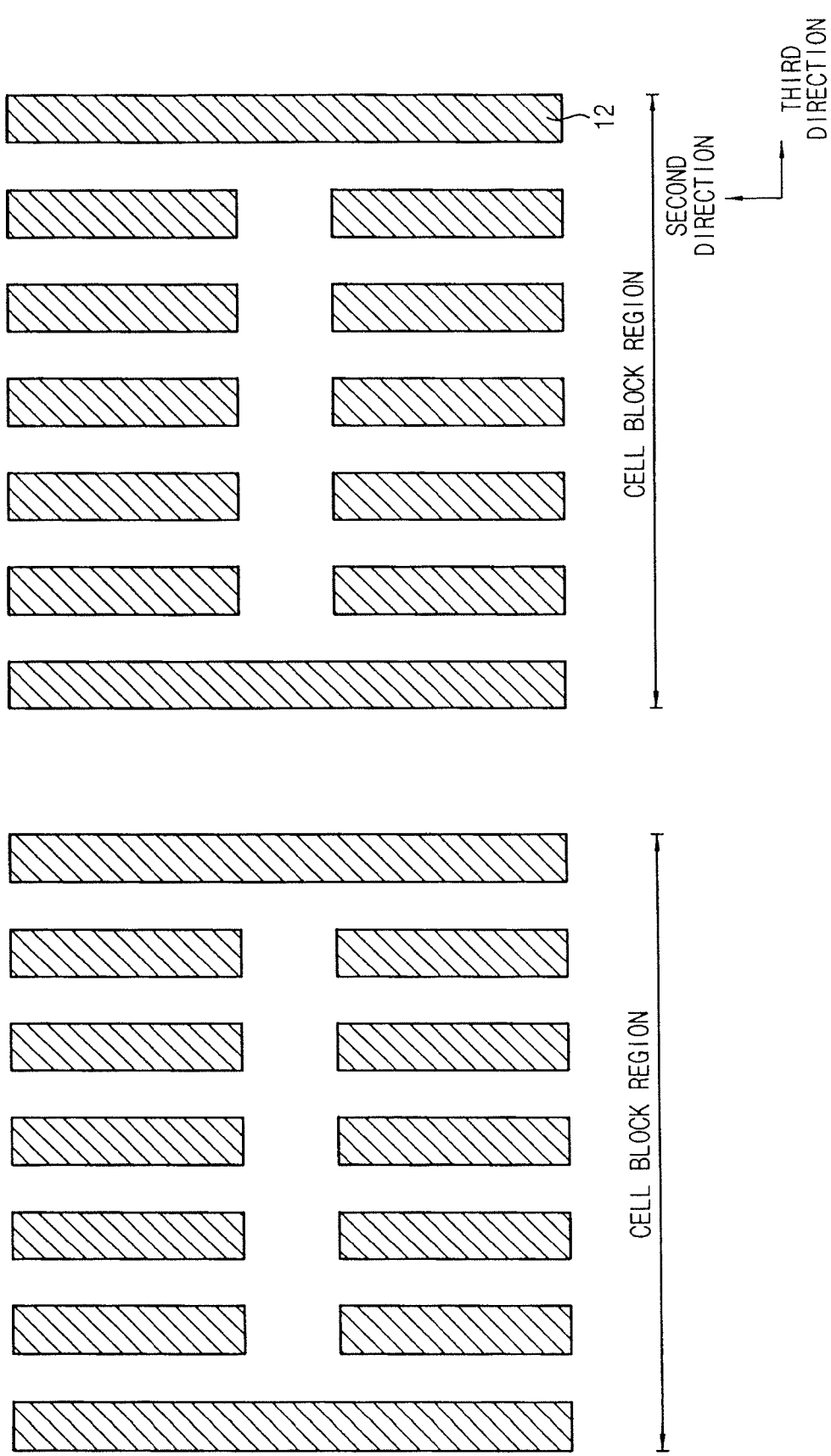

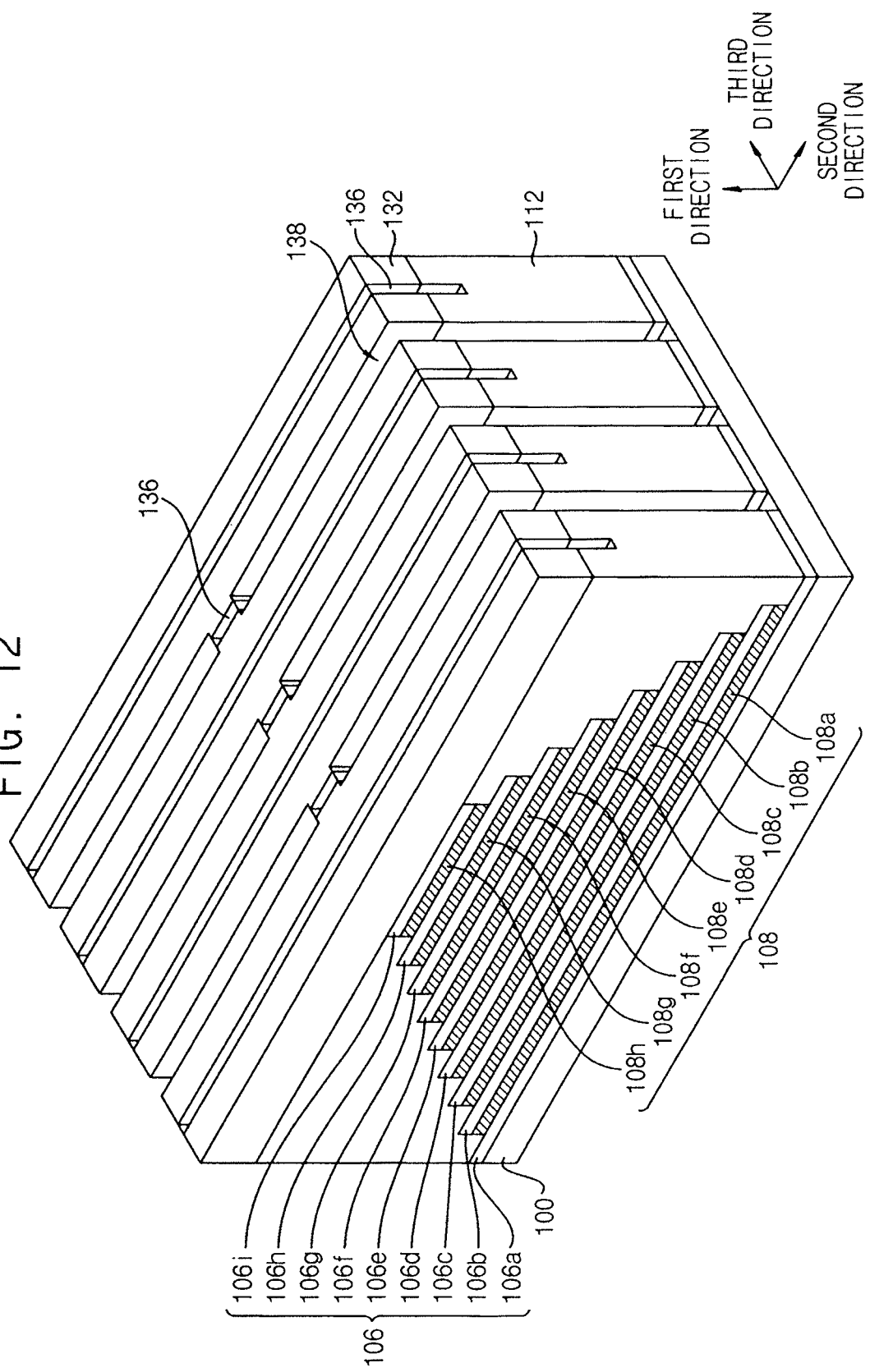

FIG. 22
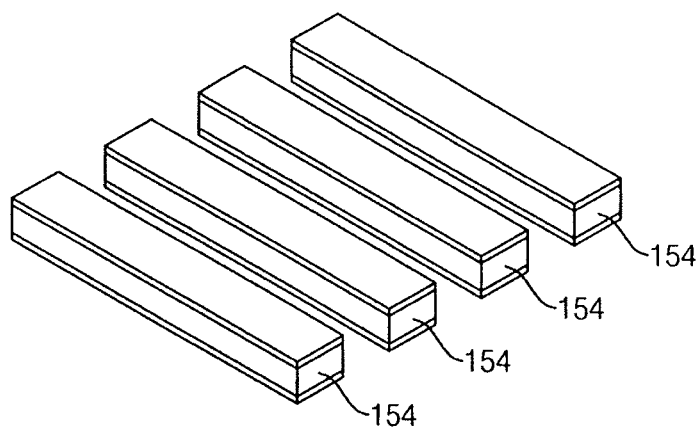
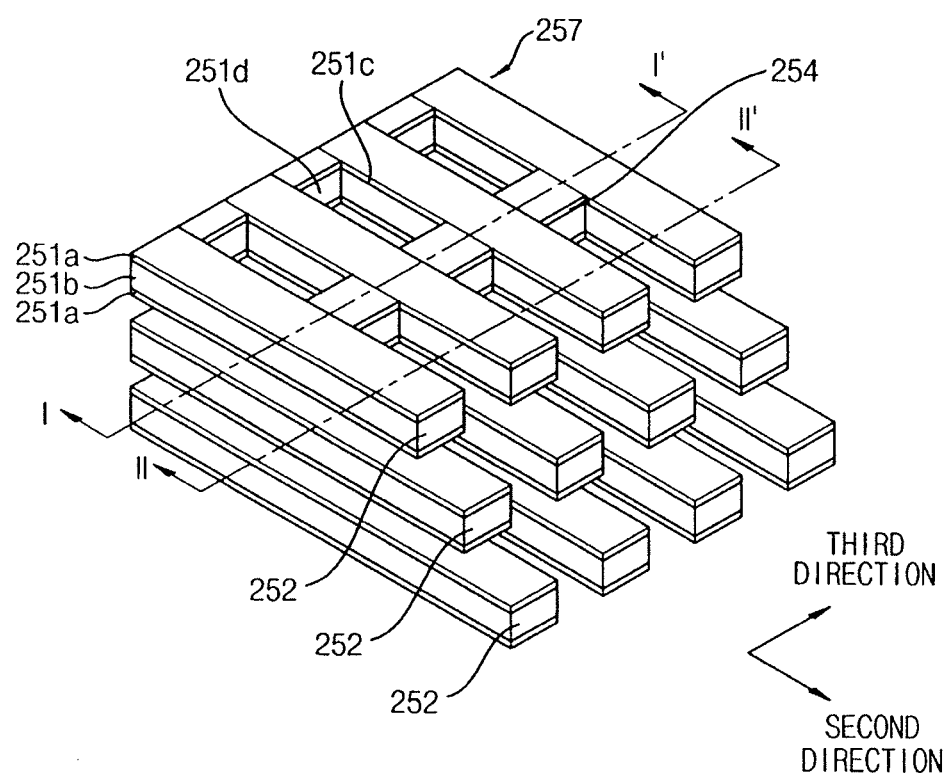

VERTICAL TYPE SEMICONDUCTOR DEVICES

CROSS-REFERENCE TO RELATED APPLICATION

Korean Patent Application No. 10-2013-0005325, filed on Jan. 17, 2013, in the Korean Intellectual Property Office, and entitled, "Vertical Type Semiconductor Devices," is incorporated by reference herein in its entirety.

BACKGROUND

1. Field

One or more embodiments described herein relate to a semiconductor device.

2. Description of the Related Art

Various techniques have been developed for making semiconductor devices. One technique involves stacking cells in a vertical direction on a substrate, for purposes of attaining a higher degree of device integration. In such a device, word lines included in each cell may also have a vertically stacked structure. However, vertically stacking the word lines has been shown to complicate the wiring design used to apply electrical signals to the word lines.

SUMMARY

In accordance with one embodiment, a vertical type semiconductor device includes a plurality of pillar structures extending in a first direction, the pillar structures including channel patterns and being arranged in a second direction and a third direction crossing the second direction; a first word line structure surrounding the pillar structures, the first word line structure extending in the second direction and including first word lines, the first word lines being spaced apart from each other and stacked in the first direction; a second word line structure surrounding the pillar structures, the second word line structure extending in the second direction and including second word lines, the second word lines being spaced apart from each other and stacked in the first direction, the second word line structure being disposed adjacent to the first word line structure in the third direction; a plurality of connecting patterns to connect side walls of adjacent first and second word lines, the connecting patterns being electrically coupled with the first and second word lines positioned at a same level; and a plurality of string select lines coupled to string select transistors on the first and second word line structures, each of the string select lines surrounding at least one pillar structure in the third direction and extending in the second direction, and the pillar structures having a shape separate from shapes of the first and second word line structures.

Also, the first and second word lines and the connecting patterns are positioned at the same level correspond to word line patterns, and the word line pattern in one layer is connected with one contact plug and one connecting wiring electrically coupled to the contact plug.

Also, the word line patterns are arranged in a block unit and wherein the first and second word lines positioned in a block region of the block unit are electrically connected. The connecting patterns at each layer face the first direction.

Also, a ground select transistor may include a ground select line under the first and second word lines at a lowest layer.

Also, the first and second word lines extend to surround at least one pillar structure in the third direction. The first and second word lines may be wider than the string select line.

The first and second word lines may have substantially a same line width as the string select line. The connecting pattern may include a same conductive material as the first and second word lines.

Also, the conductive material comprises a barrier metal material including a metal nitride and a metal material including tungsten.

Also, a portion of the string select line facing the connecting pattern in the first direction is wider than another portion of the string select line.

Also, a plurality of stacked layer structures, wherein each stacked layer structure includes a tunnel insulating layer pattern, a charge storing layer pattern, and a blocking layer pattern arranged on a side wall of a corresponding one of the pillar structures.

In accordance with another embodiment, a vertical type semiconductor device includes a plurality of pillar structures extending in a first direction, the pillar structures including a channel pattern and being arranged in a second direction and a third direction crossing the second direction; a word line pattern including word lines and connecting patterns, the word lines surrounding the pillar structures, extending in the second direction, and being repeatedly arranged in parallel in the third direction, the connecting patterns connecting side walls of the word lines to electrically connect the word lines repeatedly arranged in parallel to each other in the third direction; and a plurality of string select lines coupled to respective string select transistors, each of the string select lines extending in a second direction and provided higher than an uppermost word line pattern and surrounding one pillar structure in the third direction, the string select lines have a shape separate from the word line pattern.

Also, a plurality of the word line patterns are stacked and spaced apart from each other in the first direction. One word line pattern of one layer is provided with one contact plug and a connecting wiring electrically coupled to the contact plug.

In accordance with another embodiment, a vertical type semiconductor device includes a first word line, a second word line, a connector to electrically connect the first word line and the second word line to form a word line pattern; at least one string select line over the word line pattern; and a number of pillars to electrically connect the at least one string select line to the first and second word lines of the word line pattern, wherein the connector is substantially coplanar with the first and second word lines.

Also, at least two pillars pass through the first word line and at least two pillars pass through the second word line. Alternatively, only one pillar passes through each of the first word line and the second word line.

Also, a plurality of the word line patterns may be included in a stacked arrangement, wherein ends of the stacked word line patterns are stepped in a predetermined direction. Widths of each of the first word line and the second word line are different from a width of the string select line.

BRIEF DESCRIPTION OF THE DRAWINGS

Features will become apparent to those of ordinary skill in the art by describing in detail exemplary embodiments with reference to the attached drawings in which:

FIG. 1 illustrates an embodiment of a vertical type memory device;

FIGS. 4A and 4B illustrate additional views of SSLs and word lines in FIG. 1;

FIGS. 5 to 17 illustrate a method of manufacturing the device in FIG. 1;

FIG. 22 illustrates SSLs and word lines in the device in FIG. 21;

DETAILED DESCRIPTION

Figure 2A:
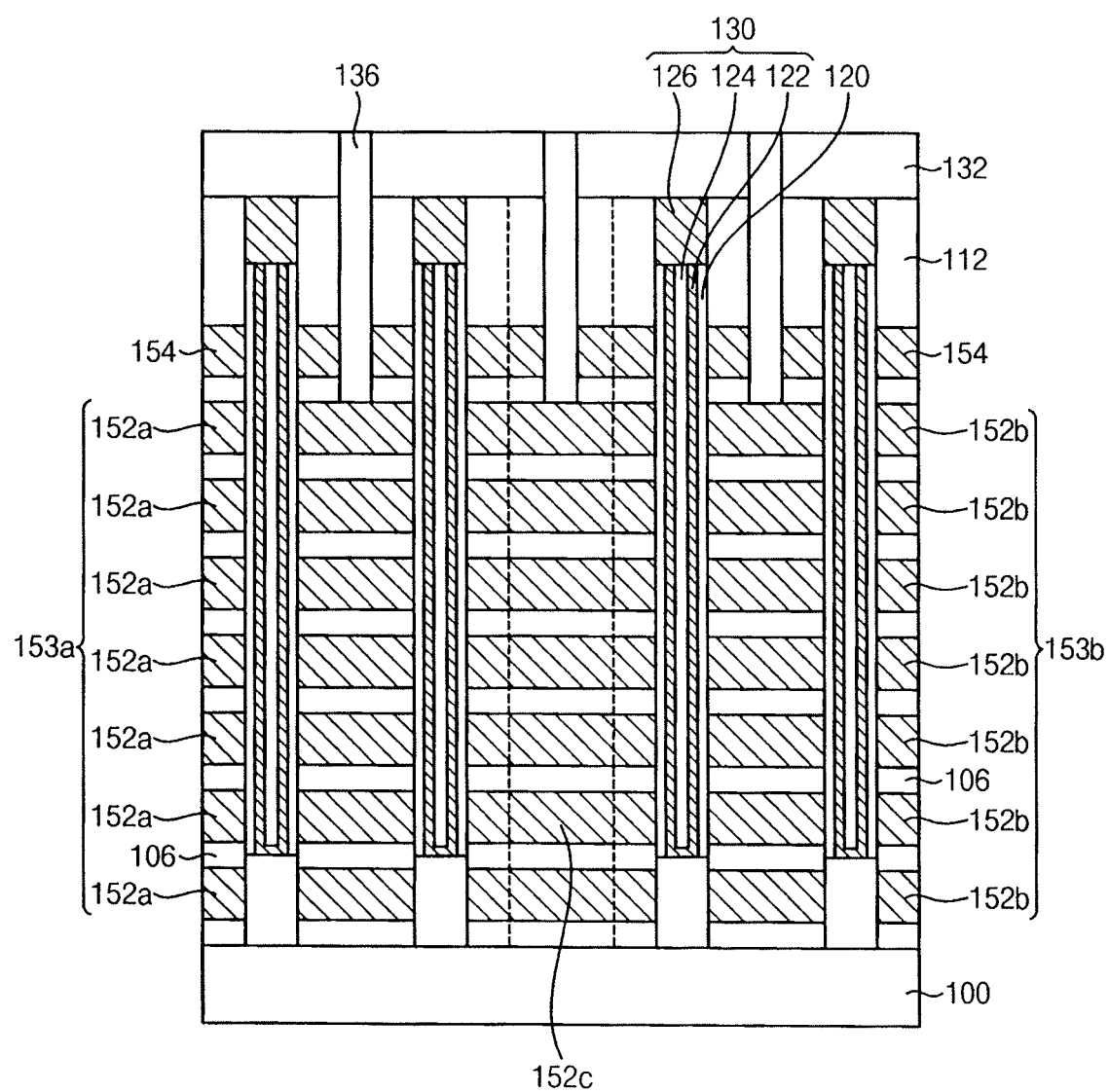
FIGS. 2A and 2B illustrate sectional views of the device in FIG. 1.
Figure 2B:
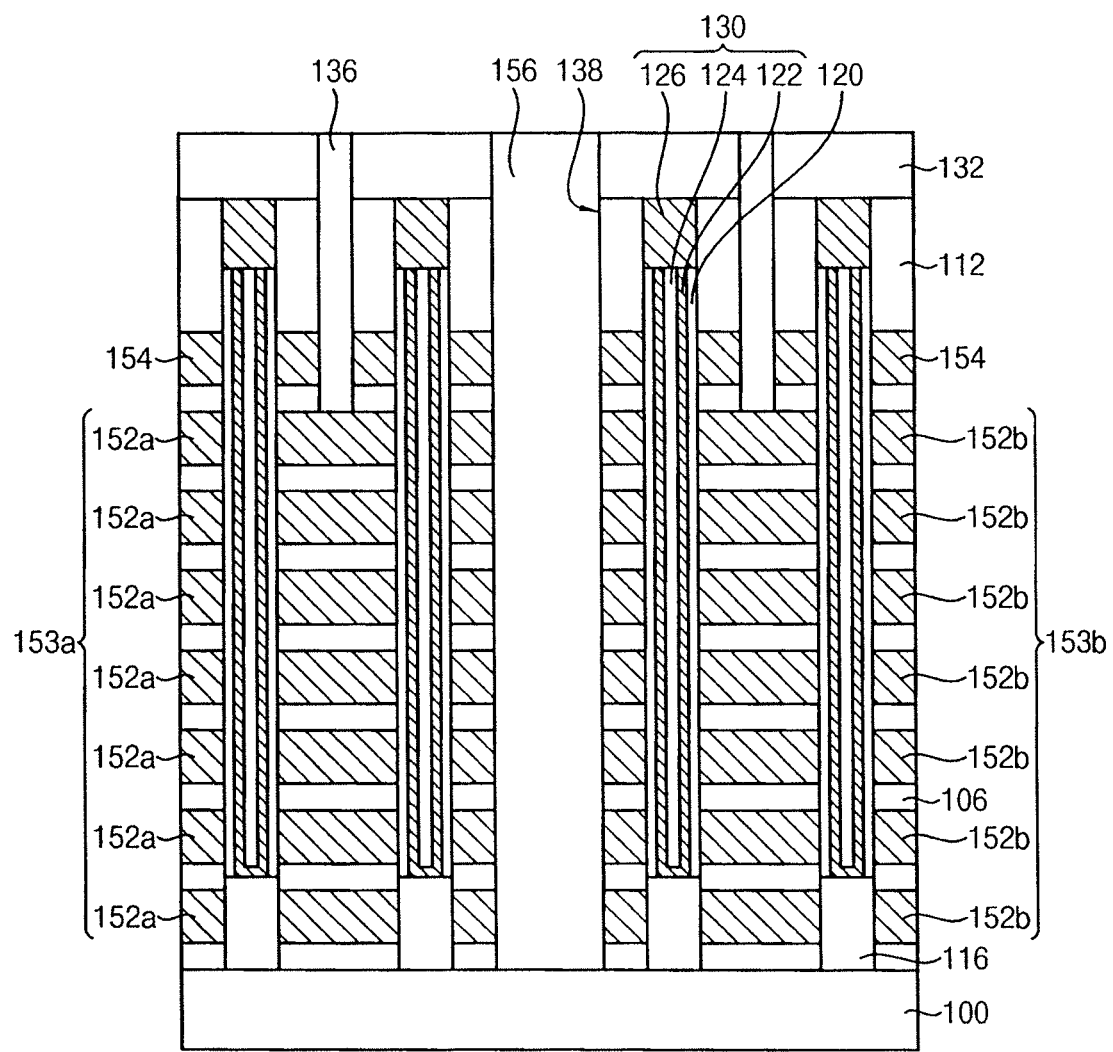

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

In the drawings, a vertical direction with respect to an upper surface of a substrate may be defined as a first direction, and two directions in parallel to the upper surface of the substrate while perpendicular to each other may be defined as a second direction and a third direction, respectively. Also, in one embodiment, the second direction may be an extended direction of a word line. In addition, the direction indicated by arrows and the counter direction thereof in the drawings may be regarded as the same direction. The definition on the directions may be the same through the drawings hereinafter.

First Embodiment

Referring to FIGS. 1 to 4B, an embodiment of a vertical type memory device which includes pillar structures 130 that extend in a first direction on a substrate 100. The substrate 100 may include a semiconductor material, for example, silicon and germanium. The device may also include a first tunnel insulating layer pattern, a first charge storing layer pattern, and a first blocking layer pattern stacked sequentially surrounding the pillar structures 130. The first tunnel insulating layer pattern, the first charge storing layer pattern, and the first blocking layer pattern are illustrated as one thin layer pattern 120.

A first word line structure 153a including stacked first word lines 152a surrounding the pillar structures 130, extending in the second direction and spaced apart from each other in the first direction, may be provided. A second word line structure 153b separated from the first word line structure 153a in the third direction and adjacently disposed to the first word line structure 153a may be provided. The second word line structure 153b may include stacked second word lines 152b surrounding the pillar structures 130, extending in the second direction and spaced apart from each other in the first direction. A conductive connecting pattern 152c for connecting the first and second word lines 152a and 152b positioned at the same level may be provided.

The word lines 152a and 152b formed at the same level may make an electric connection by the connecting pattern 152c. The word lines and the connecting pattern formed at the same level may be called as a word line pattern 157 and may be explained as follows.

On the first and second word line structures 152a and 152b, a string select line (SSL) 154 surrounding the pillar structures 130 and extending in the second direction may be included. Wiring structures 160 and 162 may be included to independently input/output electric signals to the first and second word lines 152a and 152b at each layer. In one embodiment, the vertical type memory device may include a common source line (CSL) and a bit line.

Each pillar structure 130 may include a cylindrical shape channel pattern 122 extending from the substrate 100 in the first direction, and an insulating pattern 124 filling up the inner portion of the cylinder portion on the channel pattern. In addition, a pad pattern 126 may be provided on the channel pattern 122 and the insulating pattern 124. Thus, the pillar structure 130 may have a pillar shape. The channel pattern 122 included in one pillar structure 130 may be provided as a channel region of cell transistors and select transistors included in one cell string. The channel pattern 122 may include a semiconductor material.

A semiconductor pattern 116 contacting the substrate 100 and provided as the channel pattern of a ground select transistor may be further included at the bottom surface of the pillar structure 130. The semiconductor pattern 116 may have a pillar shape formed by using a semiconductor material.

In example embodiments, a plurality of the pillar structures 130 may be formed in parallel in the second direction and the third direction. Hereinafter, the pillar structures 130 may be classified into a first channel group and a second channel group and may be explained as follows.

The first channel group may include at least one pillar structure 130 in the third direction. The second channel group may be disposed adjacent to the first channel group and may include the same number of the pillar structures 130 as in the first channel group in the third direction. The number of the pillar structures 130 in the third direction, respectively included in the first and second channel groups, may be the same as the number of cell strings shared in the third direction with respect to one word line. Particularly, when one word line shares two pillar structures 130 in the third direction, as illustrated in the drawings, two pillar structures 130 may be included in the third direction in each of the first and second channel groups.

The first tunnel insulating layer pattern, the first charge storing layer pattern, and the first blocking layer pattern may be respectively provided on the outer wall of the pillar structure 130.

In example embodiments, the first tunnel insulating layer pattern may include an oxide such as silicon oxide. The first charge storing layer pattern may include a nitride such as silicon nitride. In addition, the first blocking layer pattern may include an oxide such as silicon oxide. The first blocking layer pattern may include a metal oxide having higher dielectric constant than the silicon oxide. Examples of the metal oxides that may be used may include aluminum oxide, hafnium oxide, lanthanum oxide, lanthanum aluminum oxide, lanthanum hafnium oxide, hafnium aluminum oxide, titanium oxide, tantalum oxide, zirconium oxide, etc. These compounds may be used alone or as a stacked structure of two or more.

The first word lines 152a included in the first word line structures 153a may be supported by the pillar structures 130 and may have an extended shape in the second direction. The first word lines 152a may extend in the third direction while surrounding a plurality of the pillar structures 130. In an example embodiment, as illustrated in FIG. 1, the first word lines 152a may extend while surrounding two pillar structures 130 in the third direction. That is, the first word lines may extend while surrounding the pillar structures 130 included in the first channel group. First insulating layer patterns 106 may be provided between the first word lines 152a at the first to n-th layers in the first direction included in the first word line structure 153a.

The second word lines 152b included in the second word line structures 153a may be supported by the outer wall of the pillar structures 130 and have an extended shape. The second word lines 152b may extend in the second direction while surrounding a plurality of the pillar structures 130 in the third direction. In an example embodiment, as illustrated in the drawing, the second word lines 152b may extend while surrounding two pillar structures in the third direction. That is, the second word lines 152b may extend while surrounding the pillar structures 130 included in the second channel group. First insulating layer patterns 106 may be provided between the second word lines 152b of the first to n-th layers included in the second word line structure in the first direction.

The connecting pattern 152c may be provided between the first and second word line structures 153a and 153b, and may connect the side walls of the first and second word lines 152a and 152b at the same level. That is, the first word line 152a, the second word line 152b and the connecting pattern 152c formed at the same level may be formed as one word line pattern 157. When referring to the plan view in FIG. 4B, the word line pattern 157 formed at each layer may have an H-shape.

Between the connecting patterns 152c in the first direction, a first insulating layer pattern 106 may be provided. In addition, between the first and second word line structures 153a and 153b in the third direction, a fifth insulating layer pattern may be provided.

The connecting patterns 152c, and the first and second word lines 152a and 152b may include the same conductive material. The word line pattern 157 provided at the same level may be one body. As described above, the first and second word lines 152a and 152b, and the connecting patterns 152c may be provided in the gap portions between the first insulating layer patterns.

The connecting patterns, the first word line, and the second word line 152a, 152b and 152c may include a barrier metal layer and a metal layer. The barrier metal layer may be provided along the inner wall of the gap. In addition, the metal layer may be provided on the surface of the barrier metal layer and may have a shape filling up the inner portion of the gap.

Figure 3:
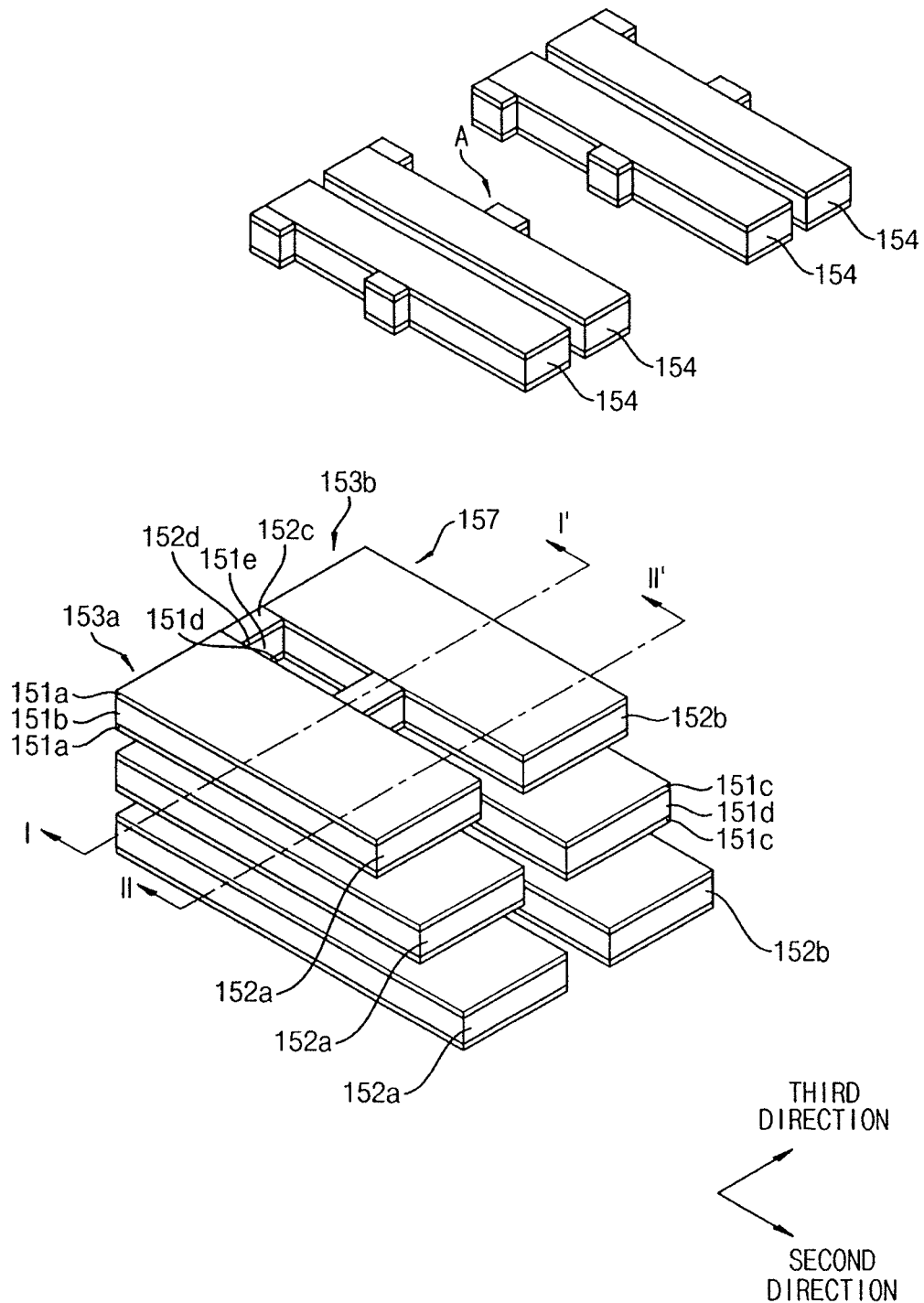
FIG. 3 illustrates string select lines (SSLs) and word lines in FIG. 1.

As illustrated in FIG. 3, at each layer, the first word line 152a may include at least one first barrier metal layer 151a and a first metal layer 151b, which contacts the first barrier metal layer 151a. In one embodiment, the first barrier metal layer may be provided on upper and lower surfaces of the first word line 152a and on the side wall of the pillar structure 130.

Also, at each layer, the second word line 152b may include at least one second barrier metal layer 151c and a second metal layer 151d contacting the second barrier metal layer 151c. The second barrier metal layer 151c may be provided on upper and lower surfaces of the second word line 152b and on the side wall of the pillar structure 130. Also, at each layer, the connecting pattern 152c may include a third barrier metal layer 152d and a third metal layer 151e contacting the third barrier metal layer 151d on the upper and lower surfaces of the connecting pattern 152c.

Examples of materials that may be used as the first to third barrier metal layers 151a, 151c, and 152d may include titanium, titanium nitride, tantalum and tantalum nitride. These materials may be used alone or as a stacked structure of two or more. Examples of a material that may be used as the first to third metal layers 151b, 151d, and 151e may include tungsten. Alternatively, the connecting patterns 152c and the first and second word lines 152a and 152b may include polysilicon.

As illustrated in the drawings, the first and second word line structures 153a and 153b may be alternately disposed in the third direction. For example, in one embodiment, the first word line structures 153a may be provided at even rows, and the second word line structures 153b may be provided at odd rows.

Figure 4B:
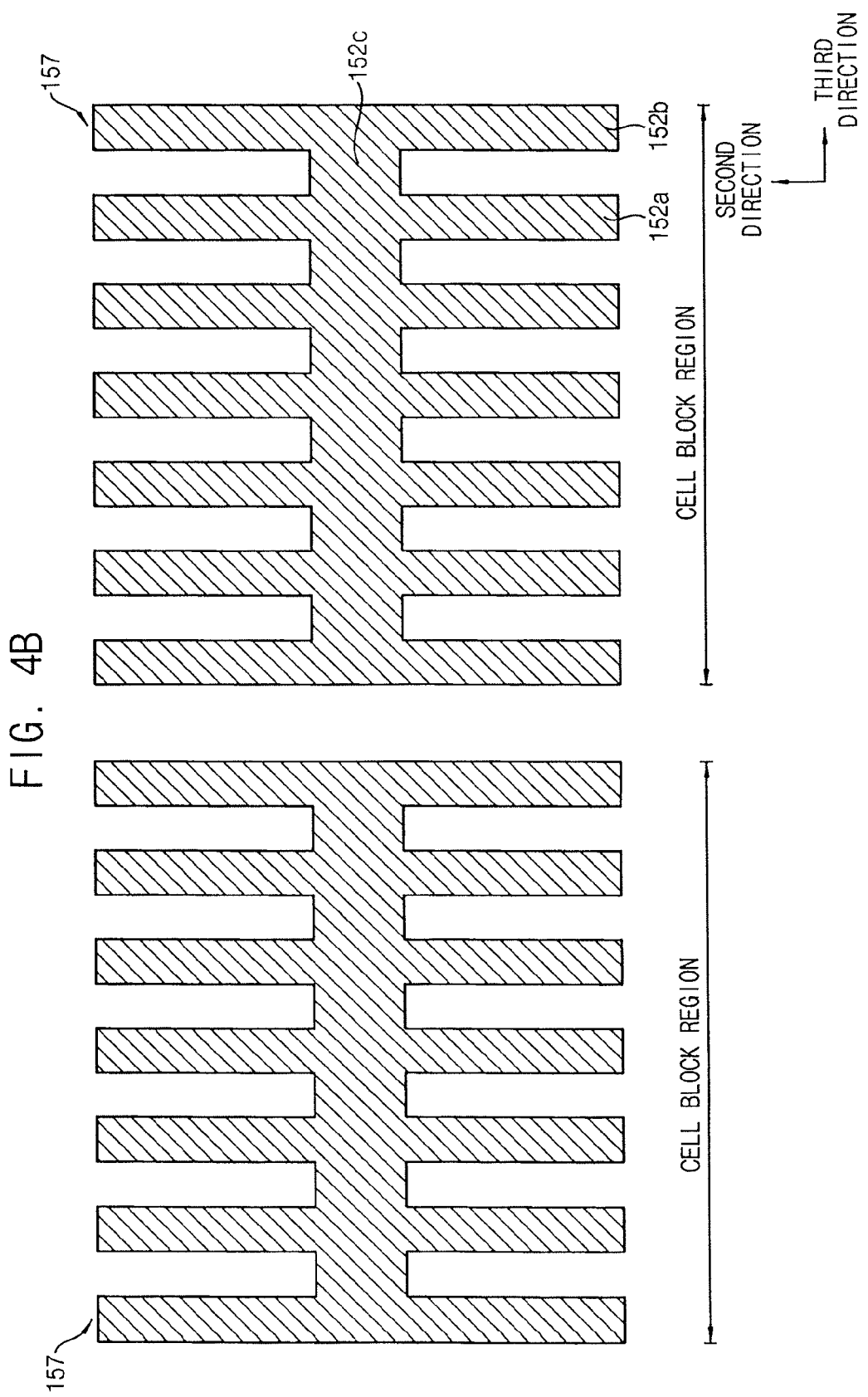

A plurality of the first and second word line structures 153a and 153b may be provided in one cell block. The connecting pattern 152c may have a shape connecting the first and second word lines 152a and 152b included in one cell block. Thus, as illustrated in FIG. 4B, the word lines positioned at the border portion of the cell block, which may be an edge of the cell block, may not make an electric connection to each other by the connecting pattern.

On the first and second word line structures 153a and 153b, string select lines 154 may be provided, respectively. The string select lines 154 may have a line shape extending in the second direction. At least one string select transistor may be required to be provided for one cell string and may not be shared in the third direction. Thus, the string select lines 154 may have an extended shape while surrounding one pillar structure 130 in the third direction.

One or more string select lines may be provided on one word line structure. For example, the first word lines 152a included in the first word line structure 153a may have an extended shape while surrounding two pillar structures in the third direction. Thus, two string select lines may be provided on the first word line structure 153a.

The string select lines 154 neighboring in the third direction may be required to be electrically disconnected from each other. Thus, the connecting pattern 152c may not be provided between the string select lines 154. Meanwhile, on a portion of the side wall of the string select line 154, a protruded portion A to a side portion may be included, as shown, for example, in FIGS. 3 and 4A. The protruded portion A may be formed, for example, by cutting the connecting pattern 152c portion formed while manufacturing the string select lines 154. Thus, the protruded portion A may be positioned at a portion for forming the connecting patterns 152c. An isolated layer pattern 136 may be provided between the string select lines 154.

A ground select transistor may be provided under the first and second word line structures 153a and 153b. Thus, a conductive pattern under the first and second word line structures 153a and 153b may be provided as a ground select line (GSL) 150. The GSL 150 may have the same shape as the first and second word lines 152a and 152b. Also, the SSL 154 and the GSL 150 may be formed as one layer or more layers.

An independent electric signal may be applied into the first and second word lines 152a and 152b at each layer included in the first and second word line structures 153a and 153b. Thus, in one embodiment, the edge portion of the first and second word lines 152*a* and 152*b* at each layer may be provided as a pad region for wire connection.

The first word line positioned at the lower layer in the first word line structure 153*a* may have a long shape in the second direction. The length in the second direction of the first word line may become less approaching the upper layer. That is, the first word lines 152*a* included in the first word line structure 153*a* may have a step shape in an edge portion. The second word lines 152*b* included in the second word line structure 153*b* also may have the same shape as the first word lines 152*a*. That is, the second word lines 152*b* included in the second word line structure 153*b* may have the step shape in an edge portion.

Also, insulating interlayers 112 and 132 covering the first and second word line structures 153*a* and 153*b* may be provided.

The wiring structure may independently input and output electrical signals into the first and second word lines 152*a* and 152*b* at each layer, and may include contact plugs 160 and wiring lines 162. The contact plugs 160 may have a shape contacting at least one of the word lines 152*a* and 152*b* at each layer. The contact plugs 160 may contact the upper surface of the first or second word line 152*a* or 152*b* at each layer through the insulating interlayers 112 and 132.

The first and second word lines 152*a* and 152*b*, at the same level in one cell block, may make an electrical connection by the connecting pattern 152*c*. Thus, the contact plugs 160 may contact one word line among the first and second word lines 152*a* and 152*b* positioned at the same level. That is, only one contact plug 160 may be provided for the word lines 152*a* and 152*b* at one layer provided in one cell block. As illustrated in the drawings, when six layers of the word lines are provided for the first and second word line structures, six contact plugs may be provided in one cell block.

As described above, since the contact plugs may not be provided at both of the first and second word lines 152*a* and 152*b*, the number of the contact plugs may be substantially decreased.

The wiring line 162 may be respectively connected with the upper surface of the contact plugs 160. Through the wiring line 162, electric signals are required to be independently applied to the word lines 152*a* and 152*b* at each layer. Thus, in one embodiment, one wiring line 162 may be connected with respect to one contact plug 160; that is, there may be a one-to-one correspondence between the wiring lines 162 and the contact plugs 160.

As described above, in example embodiments, at each layer, the word lines 152*a* and 152*b* may be electrically connected by the connecting pattern 152. Thus, additional wirings for connecting the word lines 152*a* and 152*b* at each layer may not be necessary. Thus, the connecting wirings may be simplified.

At the upper portion of the substrate 100 between the first and second word line structures 153*a* and 153*b*, an impurity region may extend in the third direction and function as a common source line (CSL). A number of layers may be formed on the impurity region, including but not limited to one or more of a metal silicide pattern such as a cobalt silicide pattern or a nickel silicide pattern.

A bit line may electrically connect to the pad pattern 126 through a bit line contact. The bit line may be formed, for example, from a metal, a metal nitride, doped polysilicon, etc. In example embodiments, the bit line may have an extended shape in the third direction.

As described above, in example embodiments, the word lines formed at the same level may be connected by the connecting pattern for connecting adjacent word lines. Thus, the word lines in block units may electrically connect to each other by one or more of the connecting patterns. As a result, the contact plug and wiring line for connecting the word lines at each layer may be simplified.

FIGS. 5 to 17 illustrate perspective views, cross-sectional views, and plan views illustrated for explaining one embodiment of a method of manufacturing the vertical type memory device in FIG. 1.

Referring to FIG. 5, a first insulating layer 102 and a sacrificial layer 104 may be alternately and repeatedly stacked on a substrate 100. Thus, a plurality of the first insulating layers 102 and a plurality of the sacrificial layers 104 may be alternately stacked in the first direction. The substrate 100 may include a semiconductor material such as silicon, germanium, etc.

In accordance with example embodiments, the first insulating layers 102 and the sacrificial layers 104 may be formed through a chemical vapor deposition (CVD) process, a plasma enhanced chemical vapor deposition (PECVD) process, an atomic layer deposition (ALD) process, etc. In accordance with example embodiments, the first insulating layers 102 may be formed by using silicon oxide, and the sacrificial layers 104 may be formed by using a material having an etching selectivity with respect to the first insulating layer 102, for example, silicon nitride.

The stacking number of the first insulating layer 102 and the sacrificial layer 104 may vary according to the stacking number of the GSL, the word lines and the SSL formed in a following process. For the convenience of explanation, each of the GSL and the SSL, respectively may be formed as one layer. However, two or more of the GSL or the SSL may be formed, respectively. For illustrative purposes, six layers of the word lines are formed in the drawings. In one embodiment, 2n (n is a natural number of 1 or over) layers of the word lines may be formed. Thus, the stacking number of the first insulating layer 102 and the sacrificial layer 104 may not be limited to the number of the illustrated layers.

Figure 6:
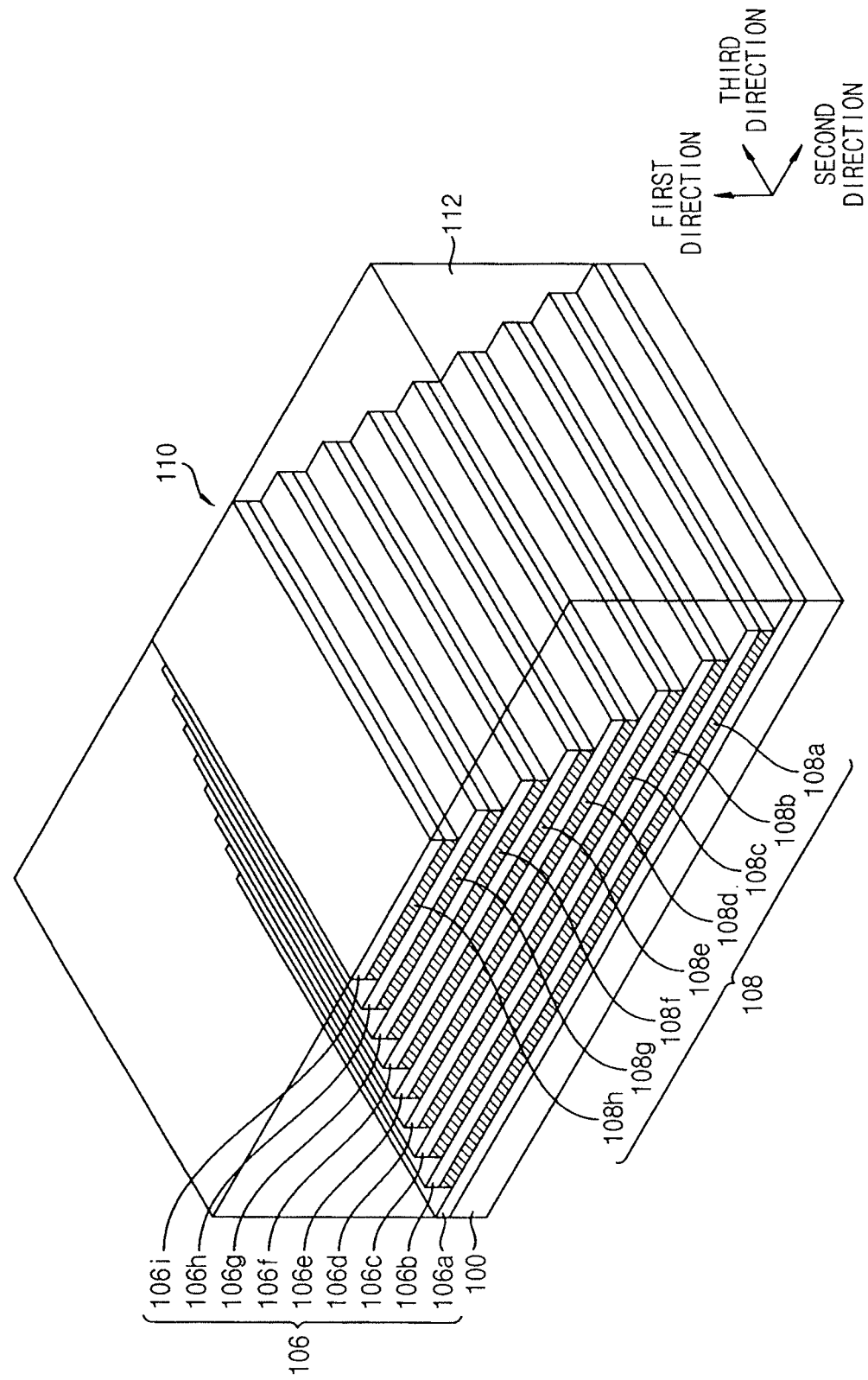

Referring to FIG. 6, a portion of the first insulating layers 102 and the sacrificial layers 104 may be etched to form a step shape pattern structure 110 having a step shape edge portion. The step shape pattern structure 110 may have a stacked shape of first insulating layer patterns 106 and sacrificial layer patterns 108. In the step shape pattern structure 110, the first insulating layer pattern 106 and the sacrificial layer pattern 108 positioned at the lower portion may have long lengths in the second direction. The lengths in the second direction of the first insulating layer patterns 106 and the sacrificial layer patterns 108 may be decreased toward the upper layer in the second direction. In the step shape pattern structure 110, one layer of the sacrificial layer pattern 106 and one layer of the first insulating layer pattern 106 may be stacked to form one layer having the step shape.

The step pattern structure 110 may be formed through performing a number of photolithography processes. The step forming portions at the edge portion of the step pattern structure 110 may be provided as connecting regions for forming connecting wirings.

A second insulating layer 112 covering the step pattern structure 110 may be formed. Then, the upper surface of the second insulating layer 112 may be planarized so as to expose the upper surface of the step pattern structure 110. The planarization process may include a chemical mechanical polishing process.

Figure 7:
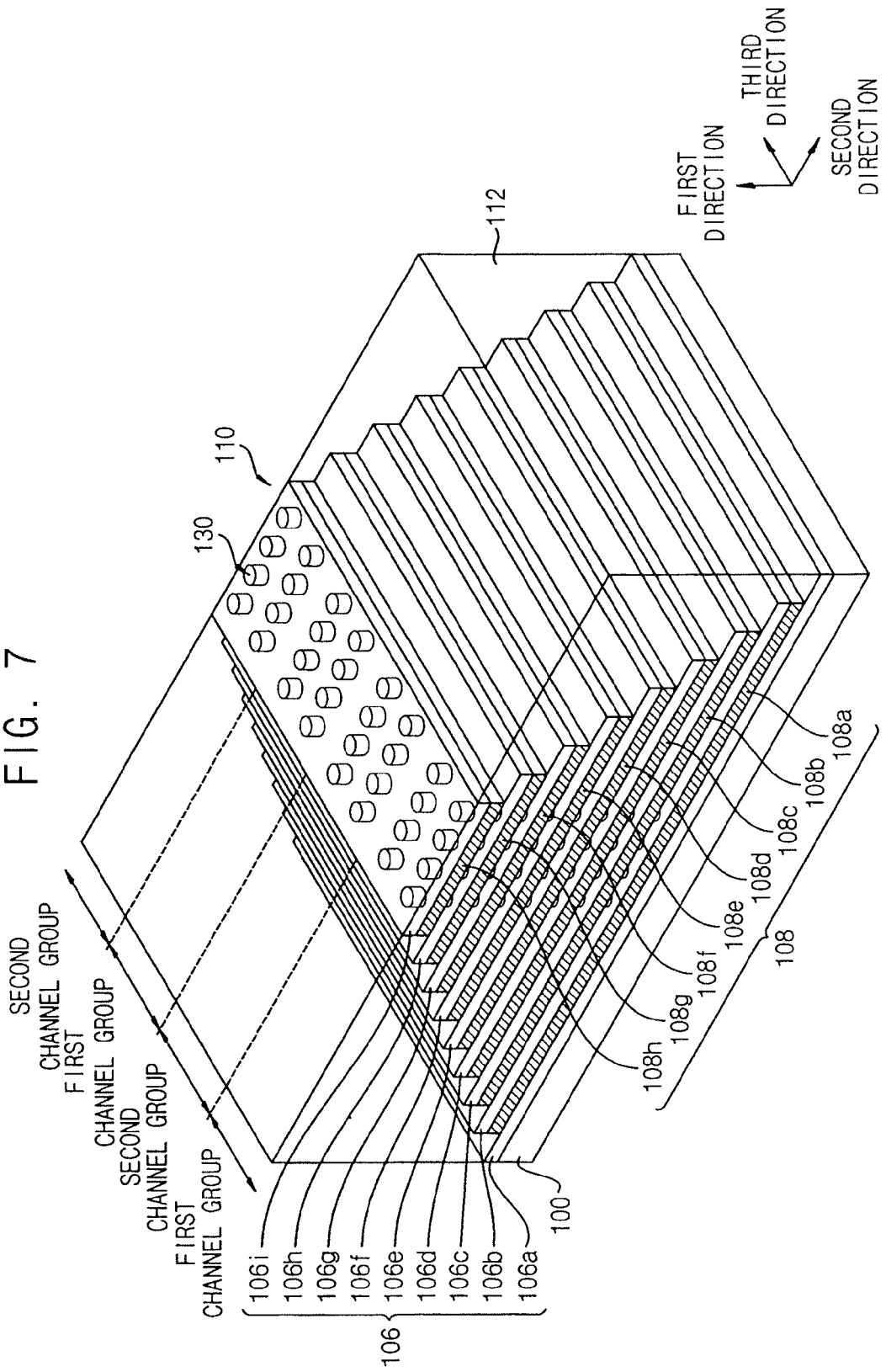
Figure 8:
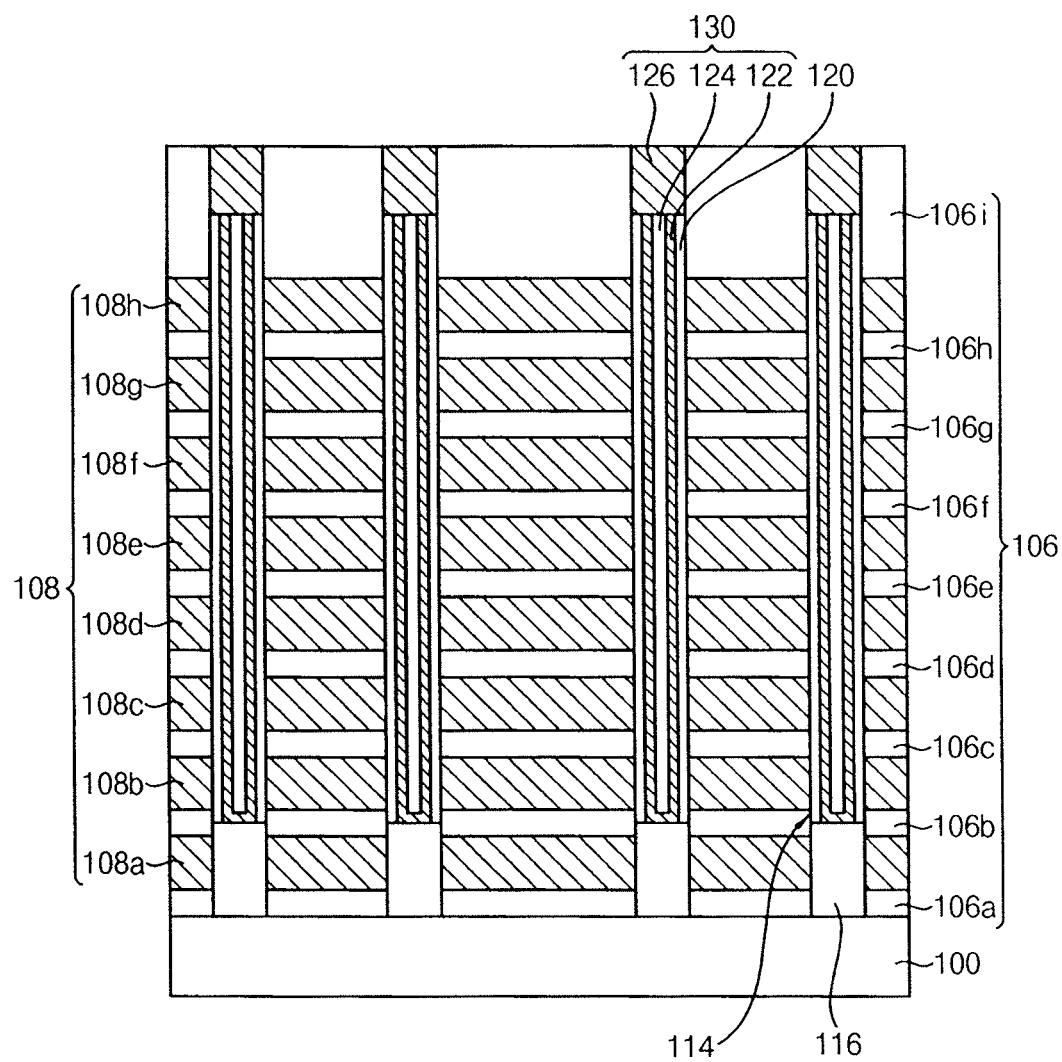

FIG. 8 illustrates a cross-sectional view taken along a pillar structure portion in the third direction in FIG. 7. Referring to FIGS. 7 and 8, a plurality of channel holes 114 exposing the upper surface of the substrate 100 through penetrating the second insulating layer 112, the first insulating layer patterns 106 and the sacrificial layer patterns 108 may be formed.

The channel holes 114 may be formed by forming a hard mask on the uppermost first insulating layer pattern 106, and performing a dry etching process using the hard mask as an etching mask. Thus, each of the channel holes 114 may be formed so as to be extended in the first direction. Due to the properties of the dry etching process, each of the holes 114 may be formed to have gradually narrowed width toward the lower portion. The channel holes 114 may be disposed in a row along the second and third directions in plurality.

A semiconductor pattern 116 partially filling up the lower portion of the channel hole 114 may be formed. Particularly, the semiconductor pattern 116 partially filling up the channel hole 114 may be formed by performing a selective epitaxial growth (SEG) process using the upper surface of the exposed substrate 100 by the channel hole 114 as a seed. Thus, the semiconductor pattern 116 may be formed so as to include single crystalline silicon or single crystalline germanium according to the material of the substrate 100.

In some embodiments, impurities may be doped into the semiconductor pattern 116. Also, in example embodiments, the semiconductor pattern 116 may be provided as a channel region of a ground select transistor (GST) in a following process. Thus, the upper surface of the semiconductor pattern 116 may be positioned between a layer including the GSL and a layer including the word line. However, the forming process of the semiconductor pattern 116 may be omitted to simplify the process.

Subsequently, a first blocking layer (not illustrated), a first charge storing layer, a first tunnel insulating layer, and a first channel layer may be formed one by one on the inner side wall of the channel holes 114, on the upper surface of the semiconductor pattern 116 and on the upper surface of the hard mask. The first blocking layer may be formed by using an oxide such as silicon oxide, the first charge storing layer may be formed by using a nitride such as silicon nitride, and the first tunnel insulating layer may be formed by using an oxide such as silicon oxide. The first channel layer may be formed by using impurity doped or undoped polysilicon or amorphous silicon. When the first channel layer is formed by using the amorphous silicon, an LEG process or an SPE process may be additionally performed in a following process to transform the amorphous silicon into crystalline silicon.

The bottom portions of the first channel layer, the first tunnel insulating layer, the first charge storing layer and the first blocking layer may be partially removed to expose the upper portion of the semiconductor pattern 116. Through performing the above processes, a first channel layer pattern, a first tunnel insulating layer pattern, a first charge storing layer pattern and a first blocking layer pattern may be formed on the side wall of the channel hole. In FIG. 8, the first tunnel insulating layer pattern, the first charge storing layer pattern and the first blocking layer pattern are illustrated as one thin layer pattern 120.

On the first channel layer pattern, a second channel layer may be formed. On the second channel layer, a third insulating layer filling up the inner portion of the channel hole may be formed and then, planarized. Through the planarization process, a channel pattern 122 of a stacked structure of the first and second channel layers may be formed. In addition, a third insulating layer pattern 124 filling up the inner portion of the channel hole may be formed.

The upper portions of the thin layer pattern 120, the channel pattern 122 and the third insulating layer pattern 124 may be partially removed to form a recessed portion. Then, a conductive material may be formed in the recess portion to form a pad pattern 126.

Through performing the above-described processes, a pillar structure 130 including the channel pattern 122, the third insulating layer pattern 124 and the pad pattern 126 may be formed in the channel hole 114. In addition, the thin layer pattern 120 including the tunnel insulating layer pattern, the charge storing layer pattern and the first blocking layer pattern may be formed on the side wall of the pillar structure 130.

The pillar structures 130 may be provided as channel regions of cell strings. Since one cell string may be provided with one pillar structure 130, the arrangement of the pillar structures 130 may be the same as the arrangement of the cell strings.

In accordance with example embodiments, one word line extended in the second direction may share two or more cell strings in the third direction. Hereinafter, the pillar structure 130 may be explained after classifying into a first channel group and a second channel group according the cell string shared by one word line in the third direction.

The first channel group may include at least one pillar structure 130 in the third direction and may be extended in the second direction. The second channel group may be disposed adjacent to the first channel group in the third direction, and may include the same number of the pillar structures as the number of the first channel groups in the third direction. Thus, the first channel group and the second channel group may be repeatedly disposed. Hereinafter, the first and second channel groups respectively including two pillar structures in the third direction will be explained.

Figure 9:
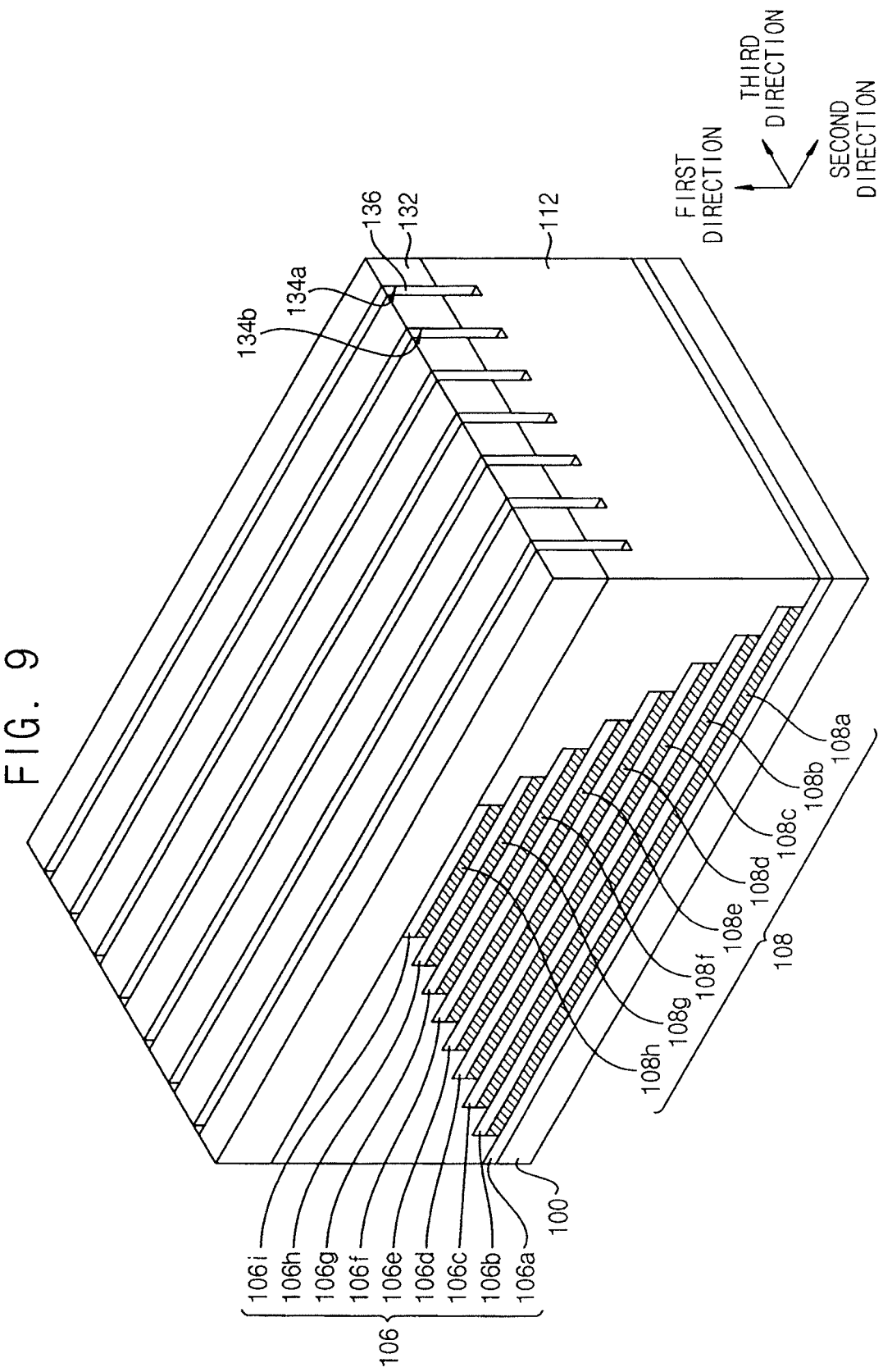
Figure 10:
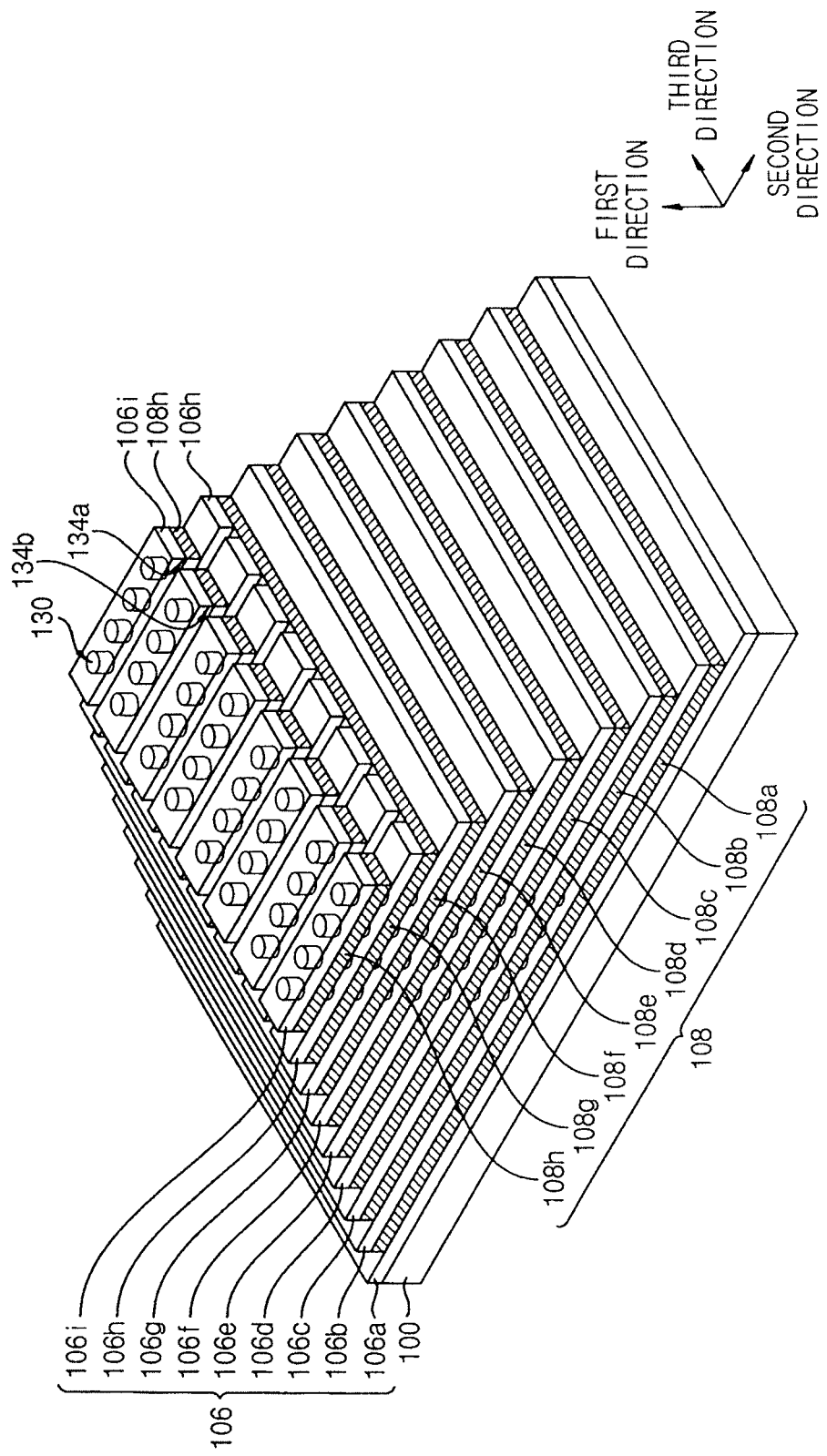

FIG. 9 illustrates a perspective view illustrating an etched portion by a first etching process according to a following explanation. FIG. 10 illustrates a perspective view only illustrating a step pattern structure portion after performing the first etching process. FIG. 11A illustrates a plan view of an exposing mask (reticle) used in the first etching process.

Referring to FIGS. 9 to 11A, a fourth insulating layer 132 may be formed on the step pattern structure 110. The fourth insulating layer 132, the first insulating layer pattern 106 and the sacrificial layer pattern 108 may be partially and firstly etched to form first and second trenches 134a and 134b for forming an SSL.

As illustrated in FIG. 11A, during performing the first etching process, an exposing mask including an exposing pattern 10 extended in the second direction may be used. The pattern formed portion of the exposing pattern 10 may become a portion to be etched. Thus, the first and second trenches 134a and 134b may have a line shape extended in the second direction. The first and second trenches 134a and 134b may be formed so as to penetrate the sacrificial layer pattern 108h and the first insulating layer patterns 106h and 106i of a layer for forming the SSL.

Particularly, when the SSL is formed as the uppermost one layer, the uppermost sacrificial layer pattern 108h and one of the first insulating layer patterns 106h and 106i positioned at the upper and lower portions of the sacrificial layer pattern 108h may be partially removed to form the first and second trenches 134a and 134b, as illustrated in the drawings.

The first trench 134a may be a trench provided in the first and second channel groups, and the second trench 134b may be a trench provided between the first and second channel groups.

As described above, one word line may share a plurality of cell strings in the third direction. That is, a plurality of pillar structures 130 sharing the word line in the third direction may be included in the first and second channel groups. Since the SSL may not share the pillar structures 130 in the third direction, one SSL line per one pillar structure 130 may be provided in the third direction. Thus, the first insulating layer patterns 106h and 106i, and the sacrificial layer pattern 108h at the portion for forming the SSL may be additionally etched, so that the first insulating layer patterns 106h and 106i and the sacrificial layer pattern 108h may have a line shape surrounding one of the pillar structures 130 in the third direction. As illustrated in the drawings, when two pillar structures 130 are included in the first and second channel groups along the third direction, the first trench 134a may be formed between two pillar structures included in the first and second channel groups.

As illustrated in FIG. 1, the first word line included in the first channel group and the second word line included in the second channel group may connected with a connecting pattern. However, the SSL may not share the pillar structures 130 in the third direction as the underlying first and second word lines. Thus, the SSLs positioned between the first and second channel groups may be separated. Accordingly, a portion disposed between the first and second channel groups of the first insulating layer patterns 106h and 106i and the sacrificial layer pattern 108 for forming the SSL may be required to be etched in advance. As illustrated in the drawings, the second trench 134b may be formed at the portions of the first insulating layer patterns 106h and 106i and the sacrificial layer pattern 108h between the first and second channel groups.

Referring to FIG. 12, after forming an insulating layer which sufficiently fills up the first and second trenches 134a and 134b, a planarization process may be performed to expose the upper surface of the step pattern structure. Through the above-described processes, an insulating layer pattern 136 may be formed in the first and second trenches 134a and 134b. The insulating layer pattern 136 may be formed by using a material having an etching selectivity with respect to the sacrificial layer patterns 108 including an oxide such as silicon oxide. In addition, the planarization process may include a chemical mechanical polishing (CMP) process and/or an etch back process.

In accordance with example embodiments, the forming process of the first and second trenches 134a and 134b and the forming process of the insulating layer pattern 136 may be conducted prior to the forming process of the channel hole 114. That is, after forming the step pattern structure as explained referring to FIG. 7, the first and second trenches 134a and 134b and the insulating layer pattern 136 may be formed. Then, the forming process of the channel hole 114 to be explained referring to FIG. 8 in a following process may be performed.

Figure 13:
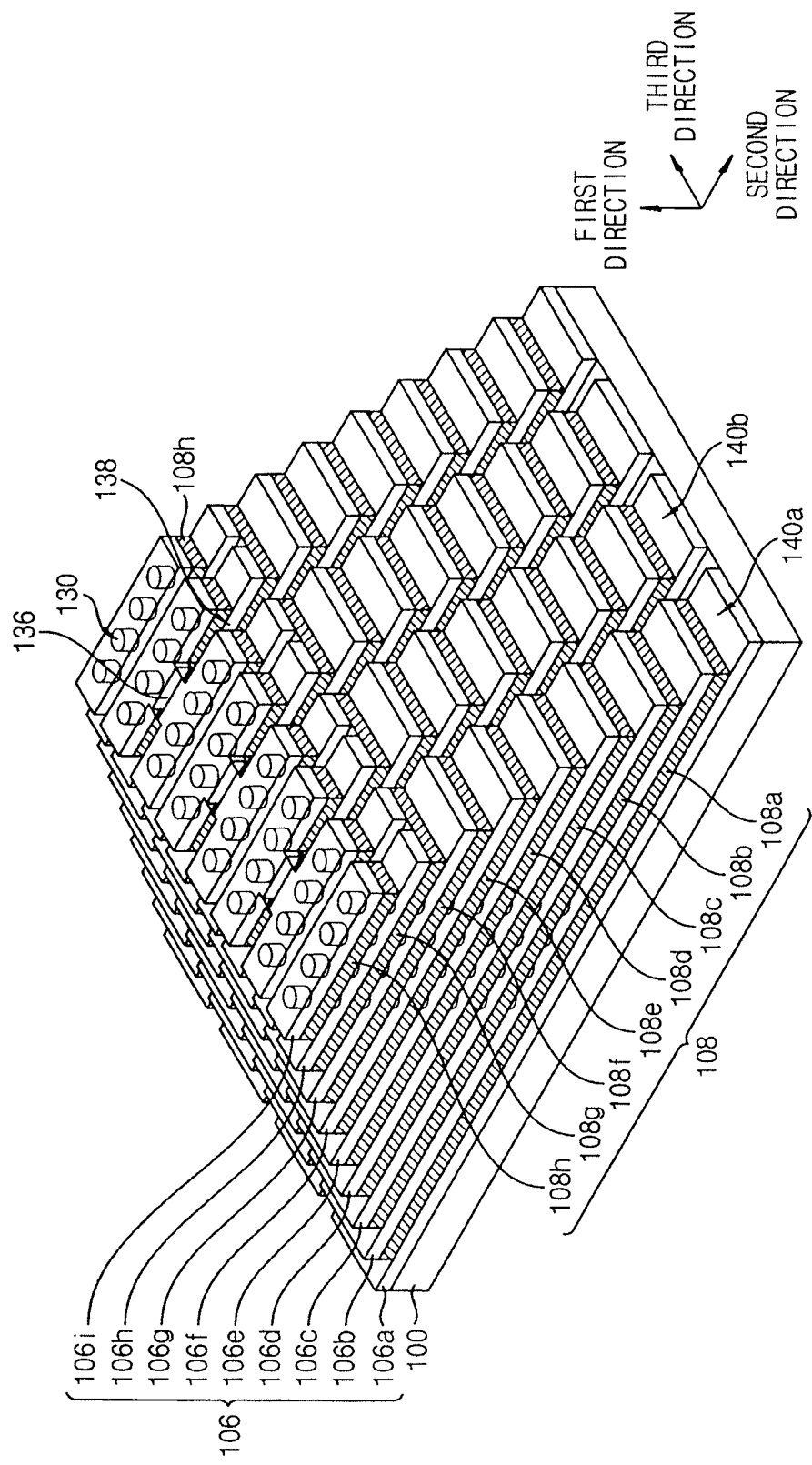
Figure 14:
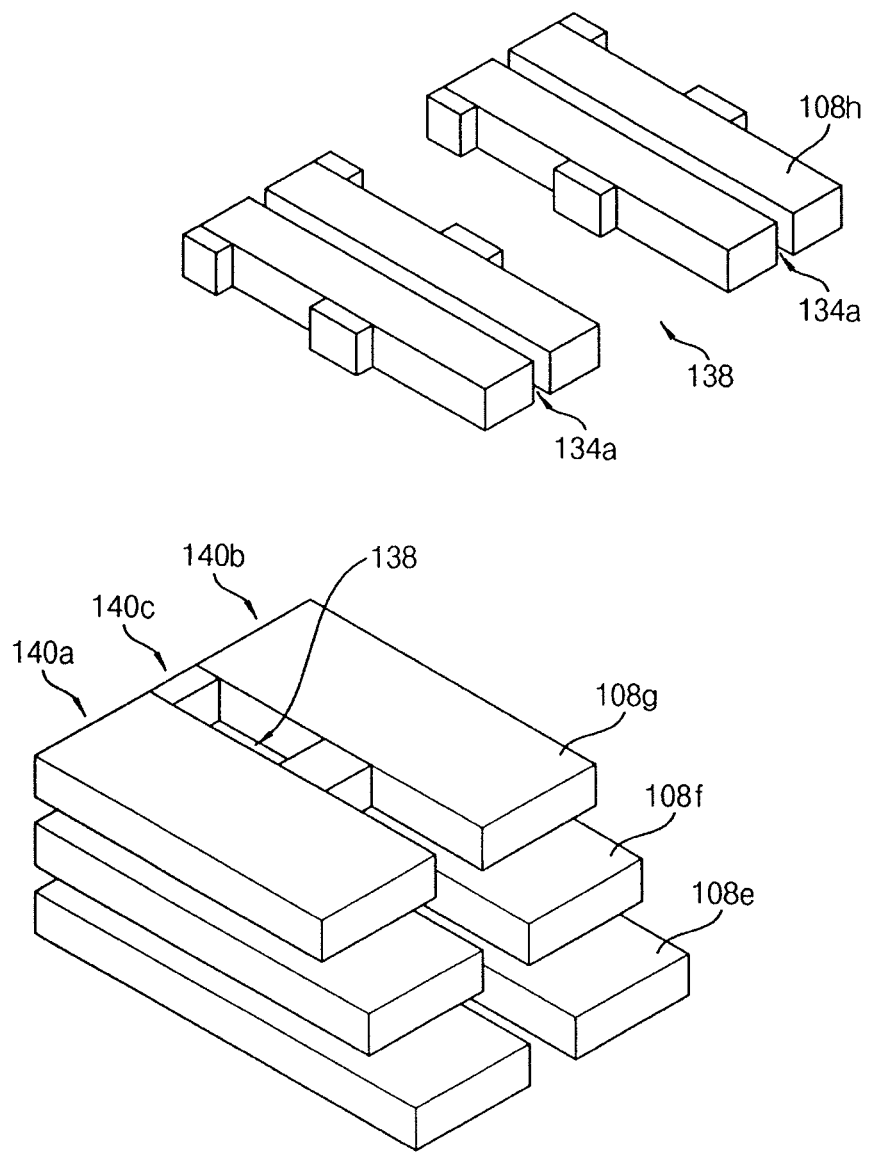

FIG. 11B illustrates a plan view of an exposing mask (reticle) used in a second etching process to be explained hereinafter. FIG. 12 illustrates a perspective view of an etched portion after performing the second etching process. FIG. 13 illustrates a perspective view illustrating a step pattern structure portion after performing the second etching process. FIG. 14 illustrates a perspective view illustrating a sacrificial layer pattern after performing the second etching process.

Referring to FIGS. 11B to 14, a first opening portion 138 exposing the upper surface of the substrate 100 may be formed by partially etching the fourth insulating layer 132, the step pattern structure 110 and the second insulating layer 112. Through forming the first opening portion 138, the step pattern structure 110 may become a mold structure for forming word lines and connecting patterns. In accordance with example embodiments, the first opening 138 may be formed by forming a hard mask on the uppermost first insulating layer pattern 106, and performing a dry etching process using the hard mask as an etching mask.

As illustrated in FIG. 11B, an exposing mask having an exposing pattern 12 having a hole shape extended in the second direction may be used in the second etching process. The pattern formed portion of the exposing pattern 12 may become a portion to be etched. In addition, the portion to be etched during the second etching process may overlap the portion for forming the second trench 134b.

As described above, the first opening portion 138 may have a hole shape extended lengthwise in the second direction. Since a plurality of the holes may be provided in the second direction, the first insulating layer pattern 106 and the sacrificial layer pattern 108 may not be removed, but may remain between the holes in the second direction.

The first insulating layer patterns 106h and 106i and the sacrificial layer pattern 108h for forming the SSL may have a respectively separated line pattern shape surrounding one pillar structure in the third direction. Besides, the first insulating layer patterns 106a to 106g and the sacrificial layer patterns 108a to 108g for forming the word line and the GSL may have a line pattern shape surrounding two pillar structures in the third direction, and the line pattern may have a connected shape at a portion.

As illustrated in FIG. 14, the first insulating layer patterns 106a to 106g and the sacrificial layer patterns 108a to 108g to be formed as the word line and the GSL may include a first stacking structure 140a, a second stacking structure 140b and a connecting structure 140c for connecting the first stacking structure 140a and the second stacking structure 140b. The first stacking structure 140a may have a line shape extended in the second direction while surrounding the pillar structures 130 of the first channel group. The second stacking structure 140b may have a line shape extended in the second direction while surrounding the pillar structure 130 of the second channel group. The connecting structure 140c may have a shape for connecting the side portions of the first and second stacking structures 140a and 140b.

From the plan view, the first stacking structure 140a, the second stacking structure 140b and the connecting structure 140c may have an H-shape, similar to the plan view illustrated in FIG. 4B. On the outer side wall of the first insulating layer pattern 106 and the sacrificial layer pattern 108 positioned at the edge portion of the cell block region, the connecting structure 140c may not be provided.

Figure 15:
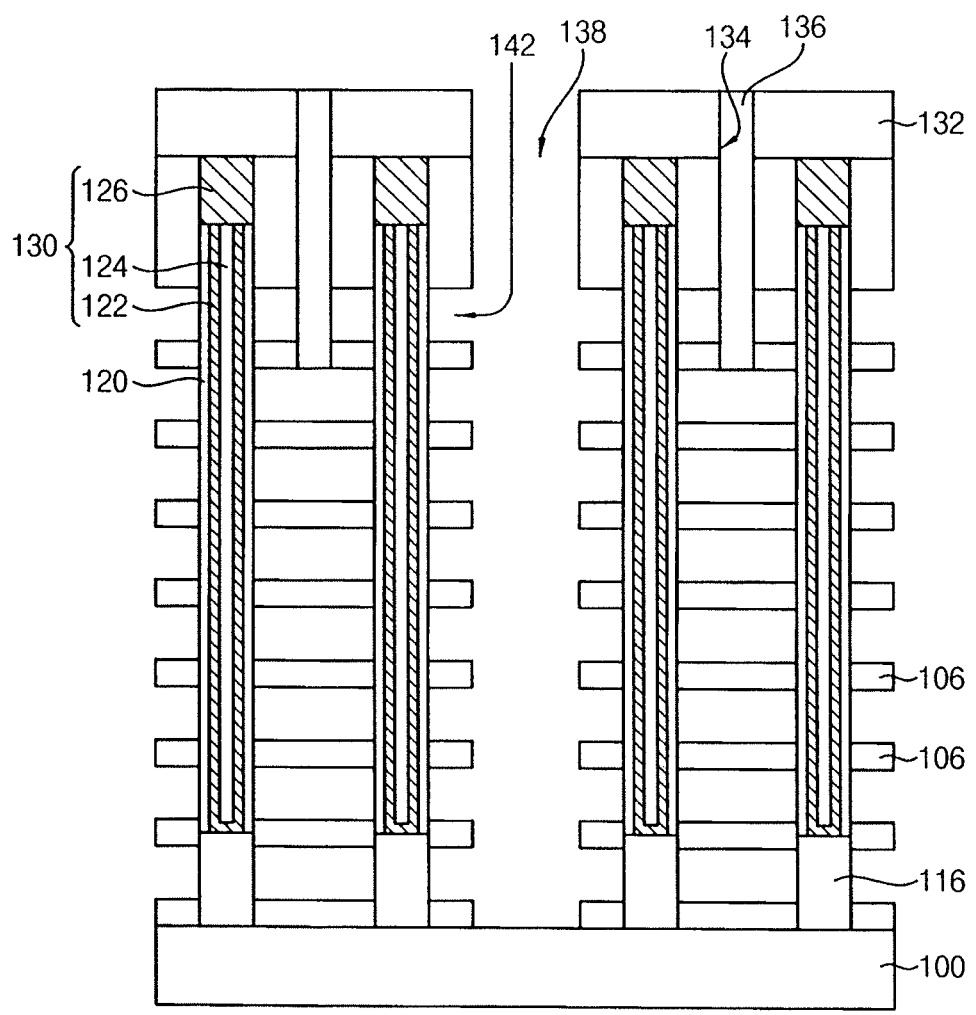
Figure 16A:
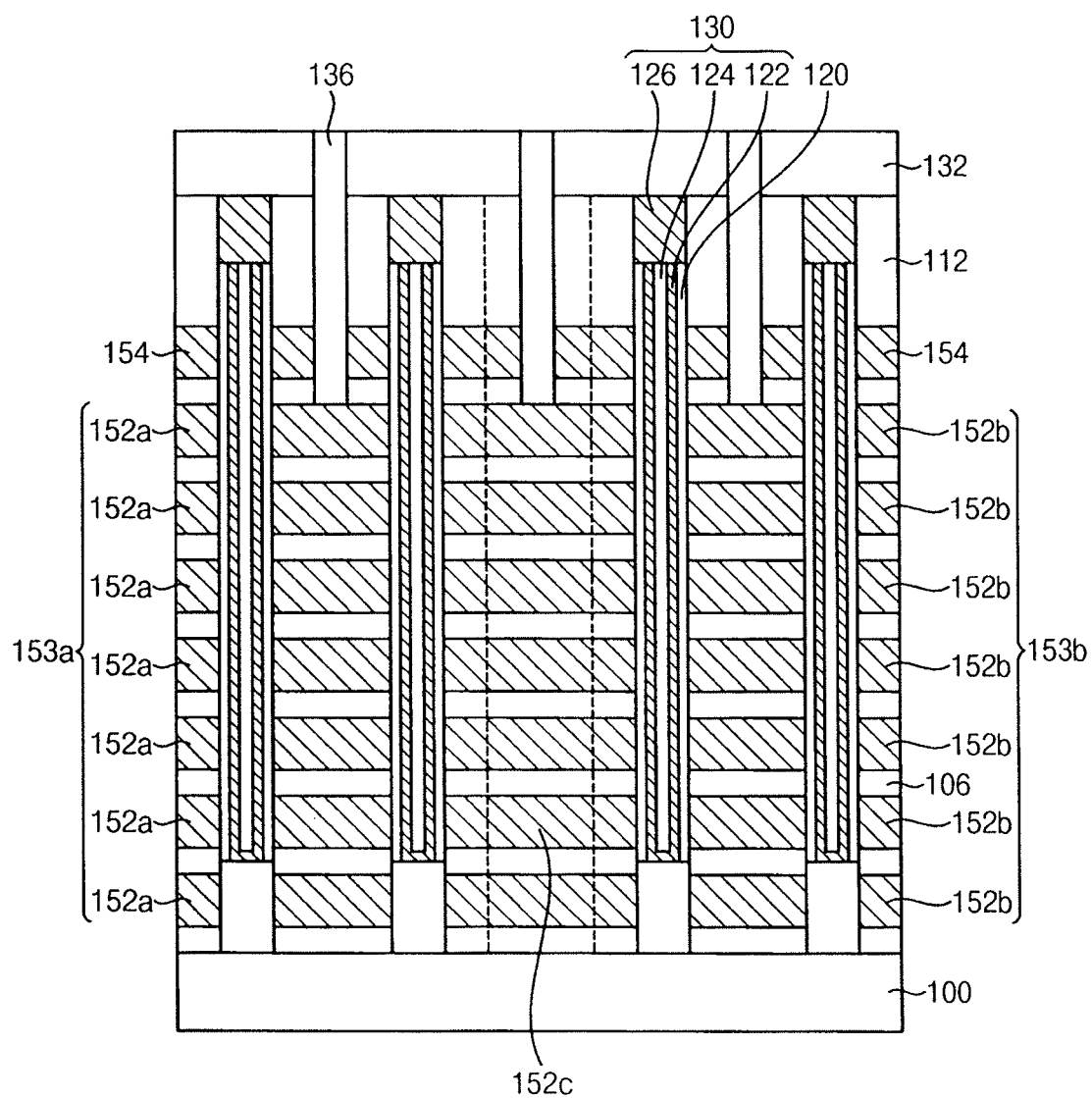
Figure 16B:
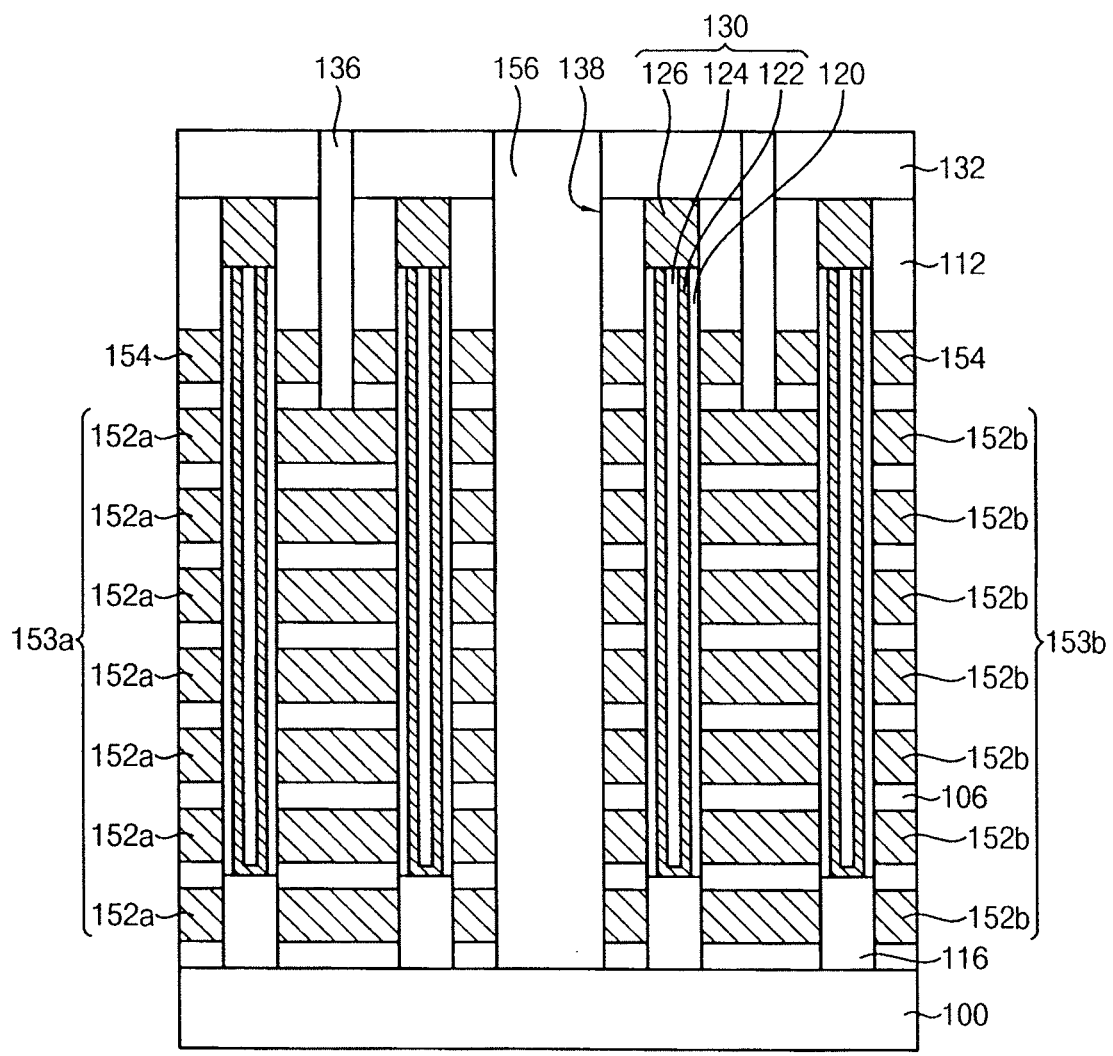

FIGS. 15, 16A and 16B illustrate cross-sectional views illustrating a method of replacing the sacrificial layer patterns with first and second word lines, SSL and GSL through a replacement process. FIG. 16A illustrates a cross-sectional view on a portion for forming a connecting pattern, and FIG. 16B illustrates a cross-sectional view on a portion excluding the connecting pattern.

Referring to FIG. 15, gaps 142 may be formed between the first insulating layer patterns 106a at each layer by removing the sacrificial layer patterns 108a. A portion of the outer wall of the first blocking layer pattern and a portion of the side wall of the semiconductor pattern 116 may be exposed by the gap 142.

Referring to FIGS. 16A and 16B, a second blocking layer may be formed on the exposed surface of the gap 142. Then, a barrier metal layer may be formed on the second blocking layer. A metal layer filling up the inner portion of the barrier metal layer may be formed. In accordance with example embodiments, the second blocking layer may be formed by using a metal oxide such as aluminum oxide, hafnium oxide, lanthanum oxide, lanthanum aluminum oxide, lanthanum hafnium oxide, hafnium aluminum oxide, titanium oxide, tantalum oxide, zirconium oxide, etc. However, the second blocking layer may not be formed.

The barrier metal layer may be formed by using titanium, titanium nitride, tantalum, tantalum nitride, etc. These compounds may be used alone or as a stacked structure of two or more. The barrier metal layer may be formed along the surface profile of the gap 142. The gap 142 may be incompletely filled up with the barrier metal layer.

The metal layer may be formed by using a metal having a low electric resistance such as tungsten. The metal layer may include, for example, tungsten.

The metal layer may be partially removed so as to remain the metal layer only in the gap 142. That is, the metal layer formed in the first opening portion 138 may be removed. The removing process may include a wet etching process. Through performing the removing process, the sacrificial layer formed portion may be replaced with a conductive layer pattern including the barrier metal layer pattern and the metal pattern. The conductive layer pattern may be provided as an SSL 154, first and second word lines 152a and 152b, a connecting pattern 152c and a GSL 150 according to the positions. Through the removing process, the previously formed first opening portion 138 may be formed again.

That is, the conductive layer pattern formed at the uppermost sacrificial layer pattern 108 may become the SSL 154. The conductive layer pattern formed at the sacrificial layer pattern 108 portion of the first stacking structure 140a may become the first word line 152a and the GSL 150. The conductive layer pattern at the sacrificial layer pattern 108 portion of the second stacking structure 140b may become the second word line 152b and the GSL 150. The conductive layer pattern at the sacrificial layer pattern 108 portion included in the connecting structure 140c may become the connecting pattern 152c.

Through performing the above-described processes, as illustrated in FIGS. 3 and 4B, first and second word line structures 153a and 153b and the connecting pattern 152c may be formed. On the first and second word line structures 153a and 153b, the SSL 154 may be formed. As illustrated in FIG. 3, an extruded portion may be formed at the side portion of the SSL 154. Since the SSL 154 may be formed by cutting the upper portion of the portion for forming the connecting pattern 152c, both sides of the cut portion may have extruded shapes.

The word lines formed at the same level may have an electrically connected shape by the connecting pattern. Each of the word line patterns 157 formed at the same level may include word lines extended in the second direction and repeatedly disposed in parallel to each other in the third direction, and connecting patterns for connecting the side walls of the word lines so as to make an electric connection of the word lines repeatedly disposed in parallel to each other in the third direction. The word line pattern 157 may have a stacked shape of a plurality of layers separated from each other in the first direction.

Impurities may be doped into the upper portion of the substrate 100 exposed through the bottom surface of the first opening portion 138 to form an impurity region. Also, metal silicide pattern may be formed in the impurity region.

A fifth insulating layer pattern 156 filling up the first opening portion 138 may be formed. In order to form the fifth insulating layer pattern 156, an insulating layer filling up the inner portion of the first opening portion 138 may be formed, and the insulating layer may be planarized until the upper surface of the uppermost fourth insulating layer may be exposed. In accordance with other example embodiments, the fifth insulating layer pattern having an inner spacer shape may be formed on the side wall of the first opening portion 138, and a common source conductive pattern filling up the first opening portion 138 may be formed on the fifth insulating layer pattern.

Figure 17:
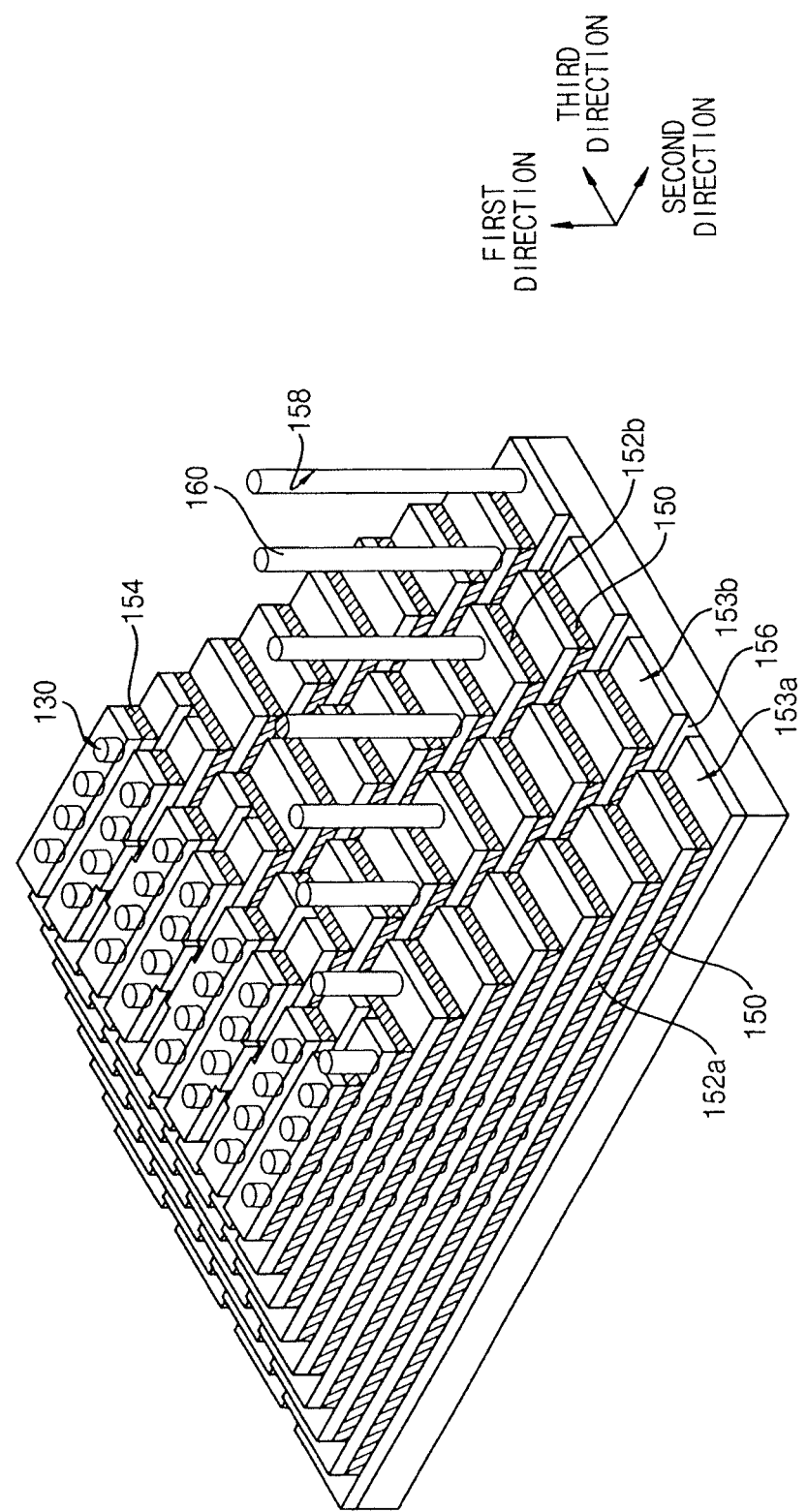

Referring to FIG. 17, a sixth insulating layer may be formed on the fourth insulating layer and the fifth insulating layer pattern 156. Through etching the sixth insulating layer, the fourth insulating layer and the second insulating layer, contact holes 158 exposing the word lines at each layer having a step shape may be formed.

As illustrated in FIG. 4B, the first and second word lines 152a and 152b positioned at the same layer may have an electrically connected state by the connecting pattern 152c by the cell block unit. Thus, the word lines positioned at the same layer in the cell block may be connected with one contact plug. Accordingly, each of the contact holes 158 may expose the upper surface of one of the word lines positioned at the same layer in the cell block. In addition, in the cell block, the same number of contact holes 158 as the number of the layers of the word lines formed in the cell block may be formed.

A conductive layer may be formed in the contact holes 158, and the conductive layer may be planarized to form a contact plug 160. The conductive layer may include a metal. The conductive layer may include a barrier metal layer and a metal layer. The barrier metal layer may include, for example, titanium, titanium nitride, tantalum, tantalum nitride, etc. These compounds may be used alone or as a stacked structure of two or more. The metal layer may include, for example, tungsten.

As described above, since all of the first and second word lines 152a and 152b may not be provided with the contact plug, the number of the contact plugs may be largely decreased.

Referring to FIG. 1 again, a wiring line may be formed on the contact plug 160. The wiring line may become a pattern for respectively applying an electric signal to the contact plug 160. Thus, one wiring line 162 may be connected to one contact plug 160.

As described above, the first and second word lines included in the vertical type memory device may have a connected shape in the cell block unit based on the connecting pattern. Thus, additional wiring for connecting the first and second word lines in the cell block unit is not necessary. Thus, the wiring in the vertical type memory device may be simplified.

Figure 18:
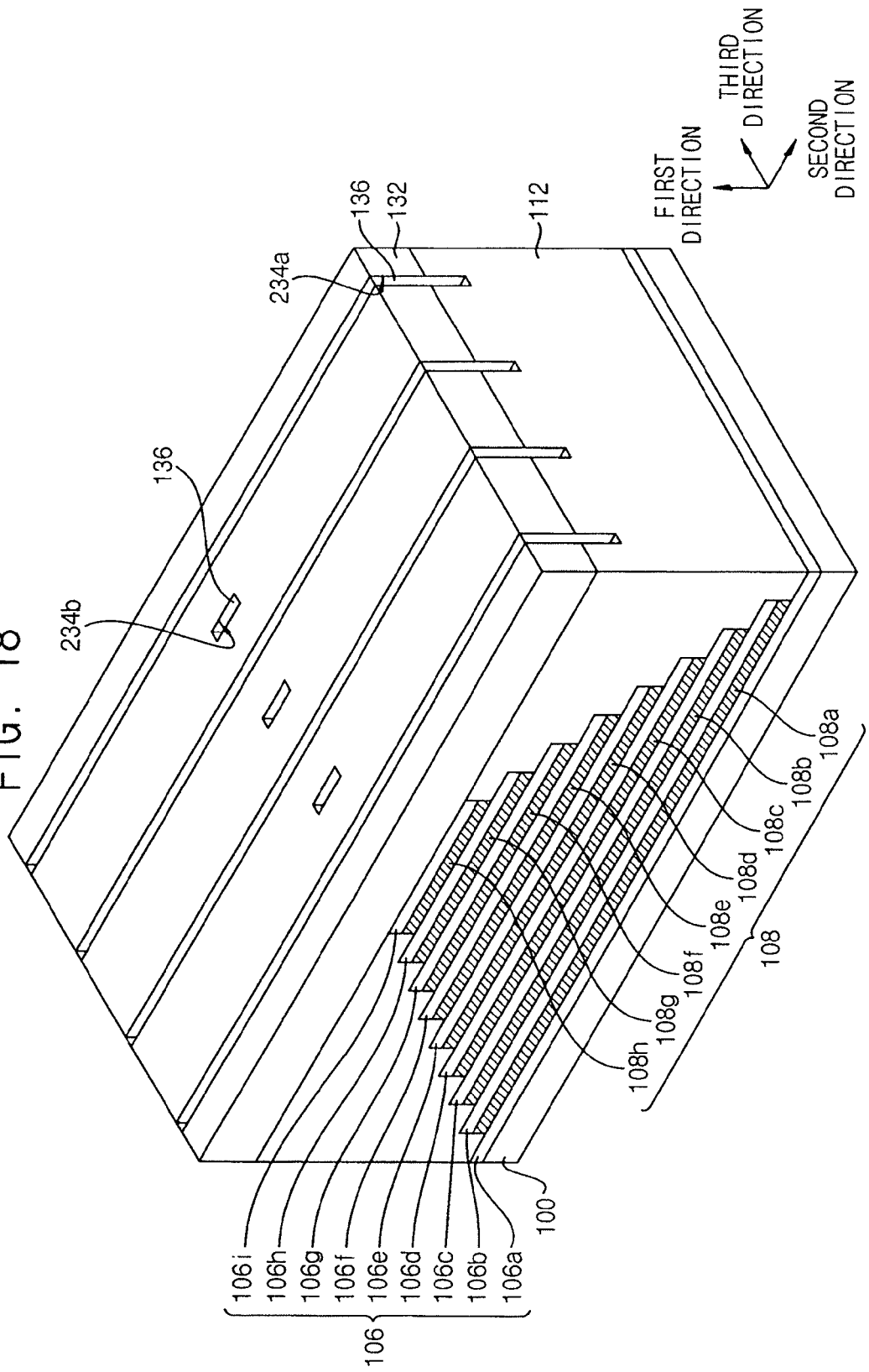
FIGS. 18 to 20 illustrate other methods of manufacturing the device in FIG. 1.
Figure 19:
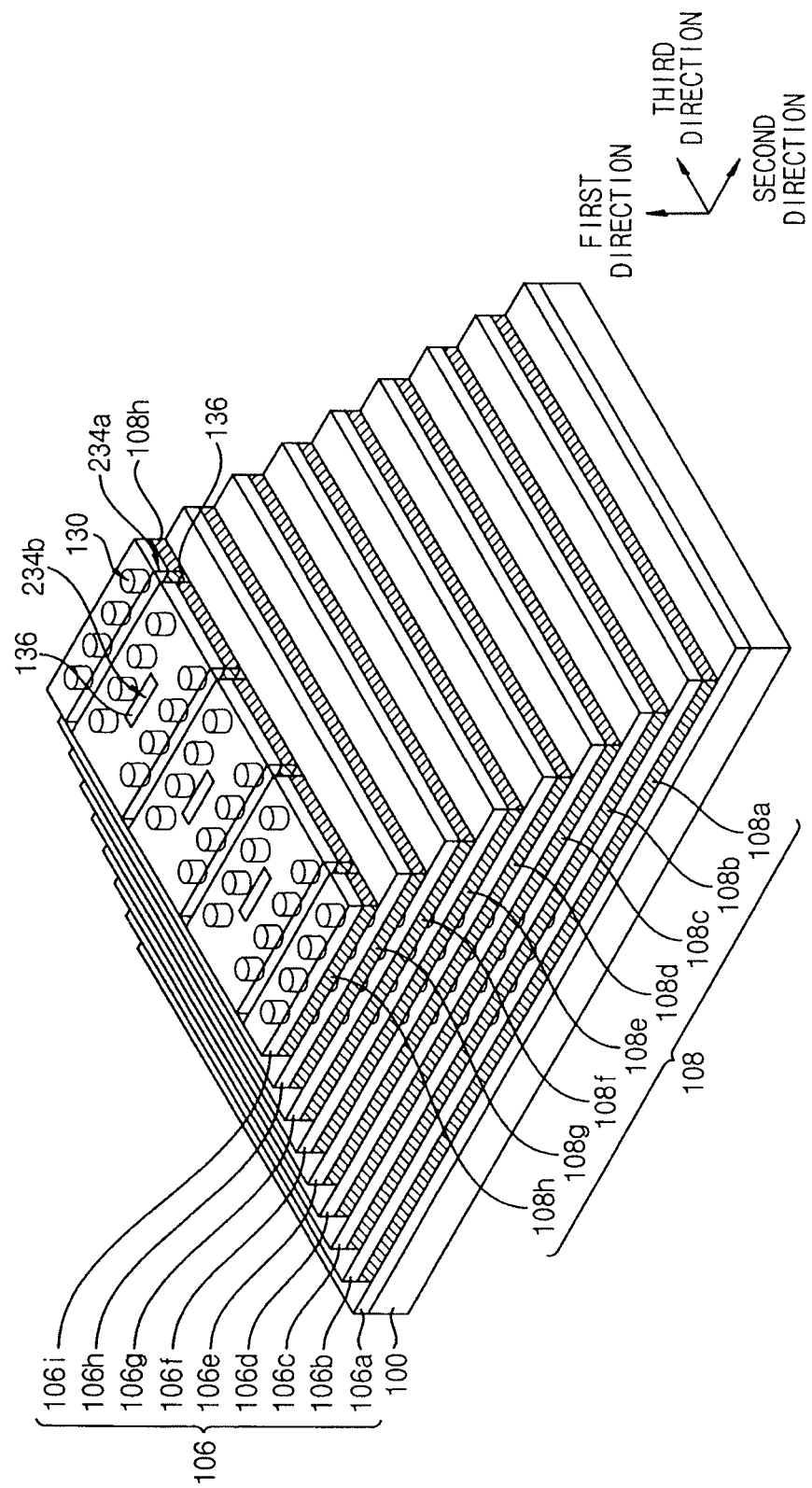
Figure 20:
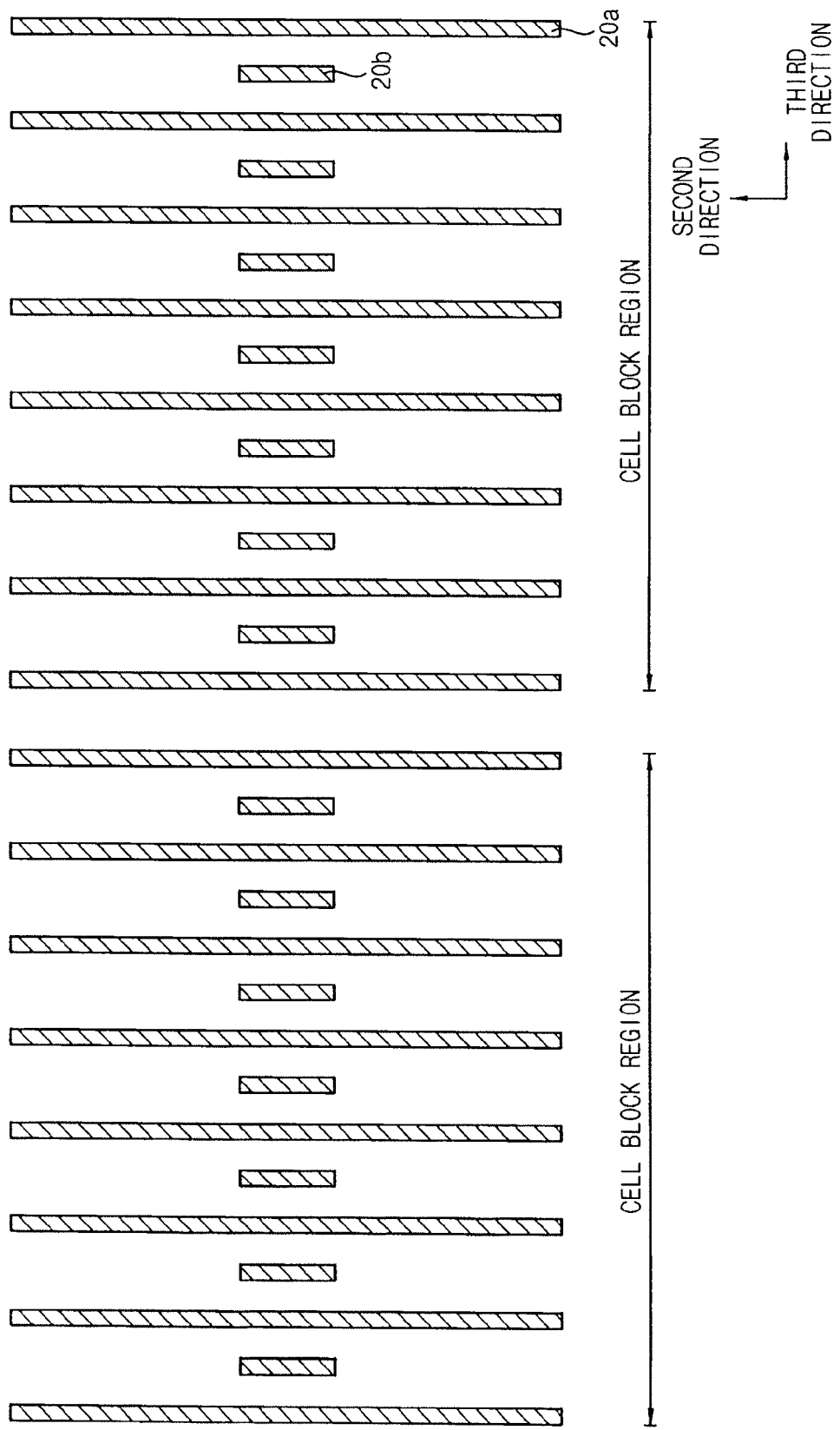

FIGS. 18 to 20 illustrate perspective views and a plan view corresponding to other embodiments of methods of manufacturing the vertical type memory device in FIG. 1. The method of manufacturing the vertical type memory device as explained hereinafter may be the same as the explanation referring to FIGS. 5 to 17 except for the portion to be etched through the first etching process for forming an SSL.

First, the processes explained referring to FIGS. 5 to 8 may be performed to form the structure illustrated in FIG. 8.

FIG. 18 illustrates a perspective view illustrating a portion to be etched using a first etching process to be explained hereinafter. FIG. 19 illustrates a perspective view illustrating a step pattern structure portion after performing the first etching process. FIG. 20 is a plan view of an exposing mask (reticle) used in the first etching process.

Referring to FIGS. 18 to 20, a fourth insulating layer 132 may be formed on the step pattern structure. The fourth insulating layer 132, the first insulating layer pattern 106 and the sacrificial layer pattern 108 may be partially and firstly etched to form a first trench 234a and a first hole 234b for forming an SSL.

As illustrated in FIG. 20, in the first etching process, an exposing mask including a first exposing pattern 20a having a line shape extended in the second direction and a second exposing pattern 20b having a hole shape between the lines may be used. The first and second exposing pattern portions may be portions to be etched by the etching process. Thus, the first trench 234a may have a line shape extended in the second direction.

The first hole 234b may be disposed between the first trenches 234a. The first trench 234a and the first hole 234b may be formed at a layer for forming the SSL so as to penetrate the sacrificial layer pattern 108h and the first insulating layer patterns 106h and 106i. Particularly, when the SSL is formed as the uppermost one layer as illustrated in the drawings, the uppermost sacrificial layer pattern 108h and one of the first insulating layer patterns 106h and 106i positioned at the upper and lower portions of the sacrificial layer pattern 108h may be partially removed to form the first trench 234a and the first hole 234b.

The first trench 234a may be provided in each channel group, and the first hole 234b may be provided between the channel groups.

Also, as illustrated in the drawings, when two pillar structures 130 are respectively included in the first and second channel groups in the third direction, the first trench 234a may be formed between two pillar structures included in the first and second channel groups. The first hole 234b may be positioned so as to face a portion for forming connecting patterns in a following process in the first direction.

Then, an insulating layer sufficiently filling up the first trench and the first hole 234a and 234b may be formed, and a planarizing process may be performed to expose the upper surface of the step pattern structure 110. Through the above-described processes, an insulating layer pattern 136 may be formed in the first trench and the first hole 234a and 234b.

In accordance with example embodiments, the forming process of the first trench and the first hole 234a and 234b, and the forming process of the insulating layer pattern 136 may be performed prior to the forming process of the channel hole 114. That is, after forming the step pattern structure 110 as described in FIG. 7, the first trench and the first hole 234a and 234b, and the insulating layer pattern 136 may be formed. After that, the forming process of the channel hole 114 as explained in FIG. 8 may be performed.

Then, a second etching process may be performed by the same method as explained referring to FIGS. 11B to 14. The exposing mask used in the second etching process may be the same as that illustrated in FIG. 11B.

Through performing the second etching process, the same structure as that explained referring to FIGS. 12 to 14 may be formed. Then, the same subsequent processes may be performed as those explained referring to FIGS. 15 to 17 to form the vertical type semiconductor device illustrated in FIG. 1.

Second Embodiment

Figure 21:
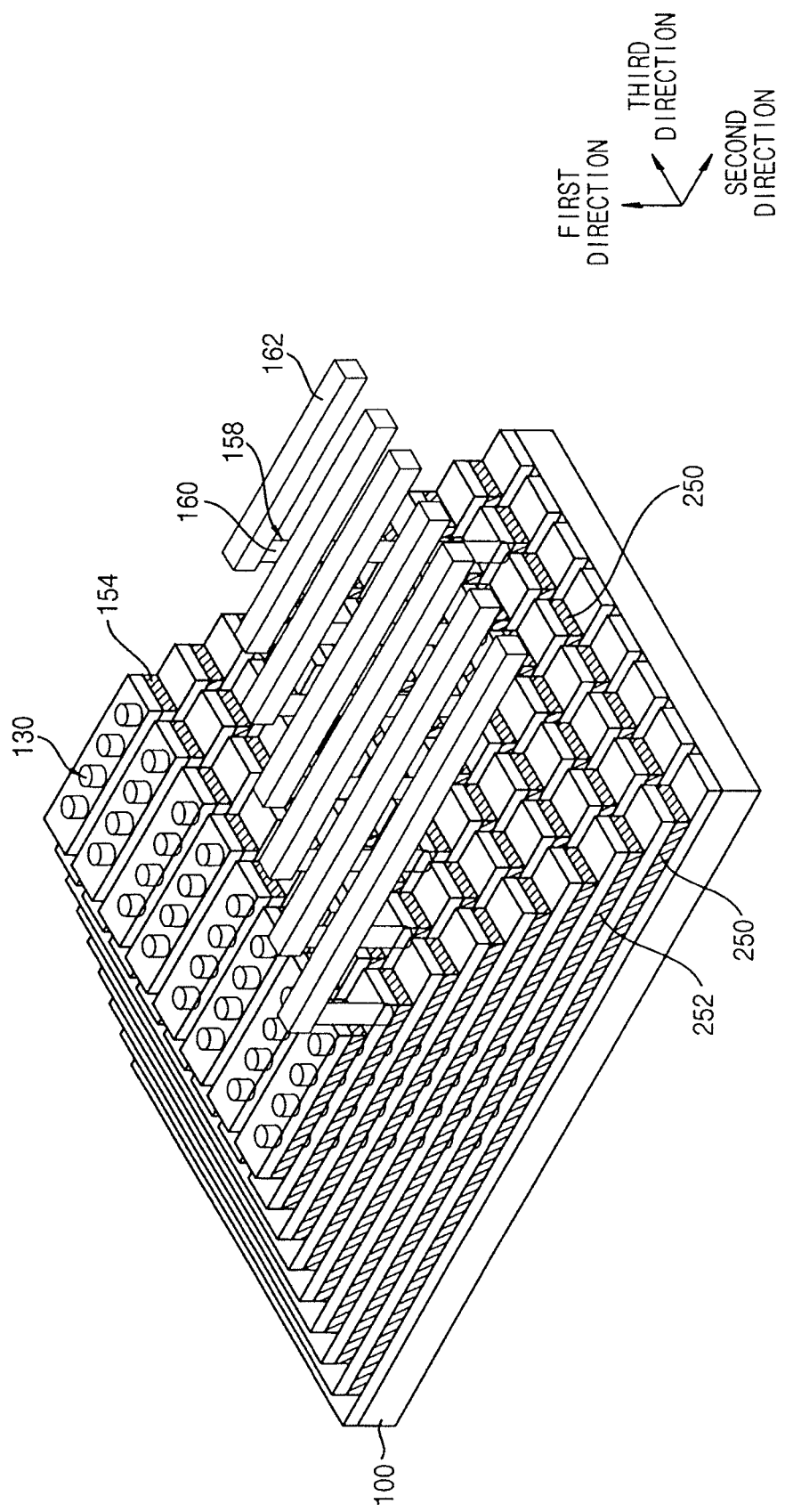
FIG. 21 illustrates another embodiment of a vertical type memory device.

FIG. 21 illustrates another embodiment of a vertical type memory device, and FIG. 22 illustrates SSLs and word lines in the device in FIG. 21. The vertical type memory device explained hereinafter may be the same as the vertical type memory device in the first embodiment, except that the word line may have a shape surrounding one pillar structure in the third direction. Also, in this example embodiment, the word line may have a shape which is not shared by multiple pillar structures in the third direction.

Referring to FIGS. 21 and 22, word lines 252 and connecting patterns 254 may be provided. The word lines 252 may be supported by the pillar structures 130 and may have an extended shape in the second direction. The word lines 252 may be extended while surrounding one of the pillar structures 130 in the third direction.

The connecting pattern 254 may be provided between neighboring word lines 252 in the third direction and may connect with the side walls of the neighboring word lines 252 at a same level. The word lines 252 at the same level may be electrically connected by the connecting pattern 254. The word lines and the connecting pattern at the same layer may be referred to as a word line pattern 157 and will be explained in greater detail below. At each layer, the word line pattern may have an H-shape from a plan point of view.

A first insulating layer pattern 106 may be provided between the connecting patterns 254 in the first direction. In addition, a fifth insulating layer pattern may be provided at a portion between the word lines in the third direction. The connecting pattern 254 and the word lines 252 may include the same conductive material. Also, the connecting pattern 254 and the word lines 252 provided at the same layer may be one body.

As in the first embodiment, each of the connecting patterns and word lines may include a barrier metal layer and a metal layer. Referring to FIG. 22, the word lines 252 at respective layers may include first barrier metal layers 251a and a first metal layer 251b which contacts the first barrier metal layer 251a on the upper and lower surfaces of the word line 252 and on the side wall of the pillar structure 130. Also, at each layer, the connecting pattern 254 may include a second barrier metal layer 251c, and a second metal layer 251d which contact the second barrier metal layer 251c on the upper and lower surfaces of the connecting pattern 254.

In addition, a plurality of word lines 252 may be provided in one cell block in the third direction. The connecting pattern 254 may connect the word lines 252 in one cell block in the third direction. Thus, the word lines 252 positioned at the boundary portion of the cell block, which may be an edge portion of the cell block, may be disconnected from each other by the connecting pattern 252. That is, one of the word line patterns 257 may be positioned in one cell block.

String select lines 154 may be provided on the uppermost word lines 252. The string select lines 154 may have a line shape extended in the second direction. As illustrated in the drawings, the word lines may be extended while surrounding one of the pillar structures 130 in the third direction, and may not share the pillar structures 130. Thus, the string select lines 154 may have substantially the same shape as the word lines 252. In addition, the string select lines 154 may face each of the word lines 252 in the first direction.

Since the string select lines 154 may be provided to be electrically separated in the third direction, the connecting pattern 254 may not be formed at the string select line 154. Since the connecting pattern 254 may not be provided between the string select lines, the neighboring string select lines in the third direction may have a separate shape.

A ground select transistor may be provided under the lowest word line 252. Thus, the conductive pattern under the lowest word line 252 may be provided as a ground select line (GSL) 250.

In the vertical type memory device in accordance with example embodiments, word lines at respective layers may be connected by a connecting pattern in a cell block unit. Thus, an additional wiring for connecting the word lines may not be necessary. Thus, the wiring in the vertical type memory device may be simplified.

FIGS. 23 to 26 illustrate an embodiment of a method of manufacturing the vertical type memory device illustrated in FIG. 21. First, the processes explained referring to FIGS. 5 to 8 may be performed to form the structure illustrated in FIG. 8.

Figure 23:
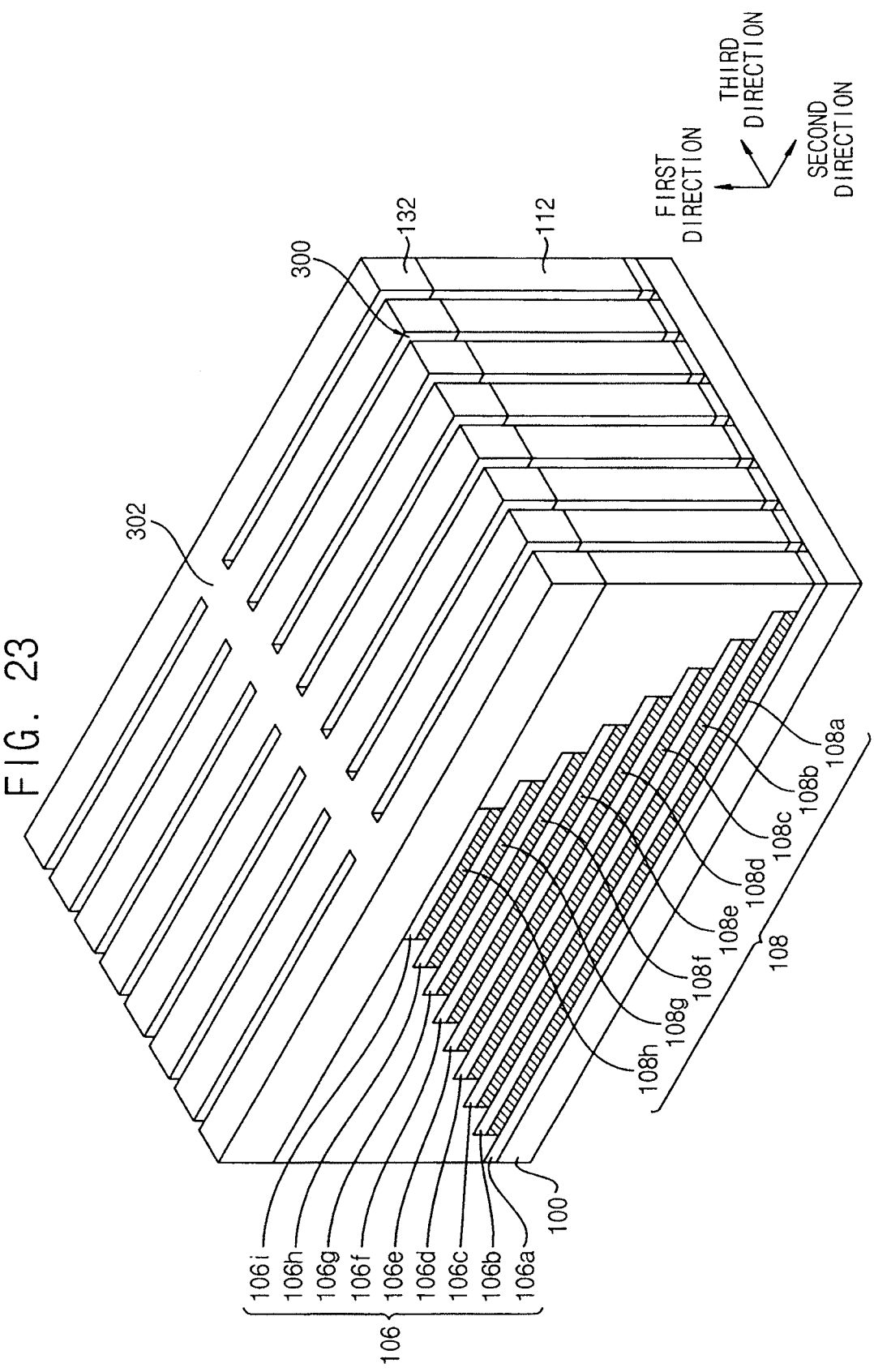
FIGS. 23 to 26 illustrate a method of manufacturing the device in FIG. 21.
Figure 24:
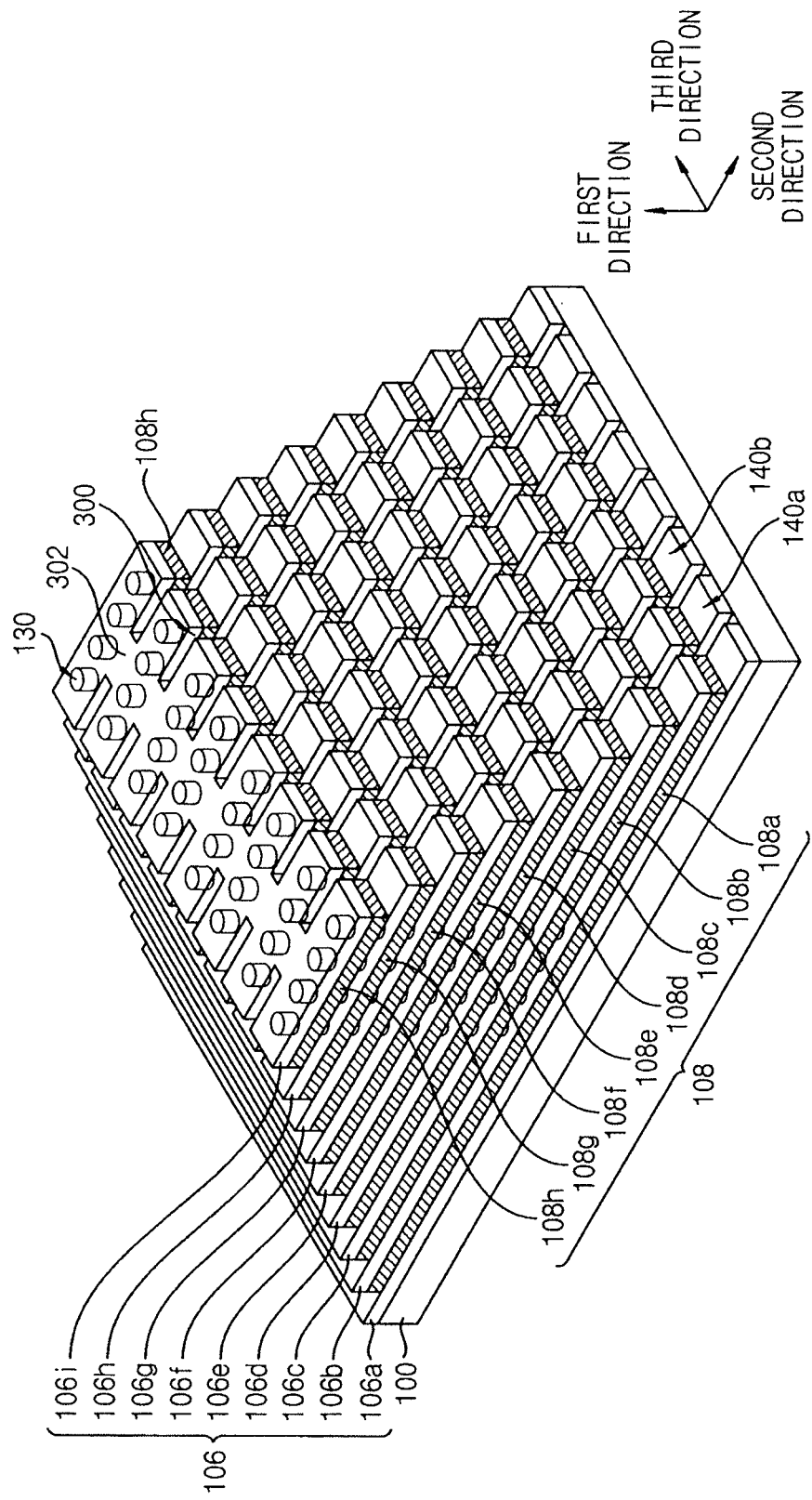

FIG. 23 illustrates a perspective view illustrating a portion to be etched using a first etching process to be explained hereinafter. FIG. 24 illustrates a perspective view illustrating a step pattern structure portion after perfoiining the first etching process.

Referring to FIGS. 23 and 24, a fourth insulating layer may be formed on the step pattern structure. The fourth insulating layer 132, the first insulating layer patterns 106 and the sacrificial layer patterns 108 may be firstly etched to form first holes 300 exposing the substrate.

Through the first etching process, the inner portion of the first holes 300 may have a line shape extended in the second direction. The step pattern structure 110 between adjacent first holes 300 in the second direction may be unetched. The unetched portion 302 in the step pattern structure 110 may become a portion for forming a connecting pattern in a following process.

The first holes 300 may be formed in a portion between neighboring pillar structures 130 in the third direction. That is, the step pattern structure 110 between the first holes 300 may have an extended shape while surrounding the pillar structures 130.

At the exposed substrate in the first holes 300, an impurity region functioning as a common source line (CSL) may be formed. On the impurity region, a metal silicide pattern such as a cobalt silicide pattern, a nickel silicide pattern, etc. may be formed.

Figure 25:
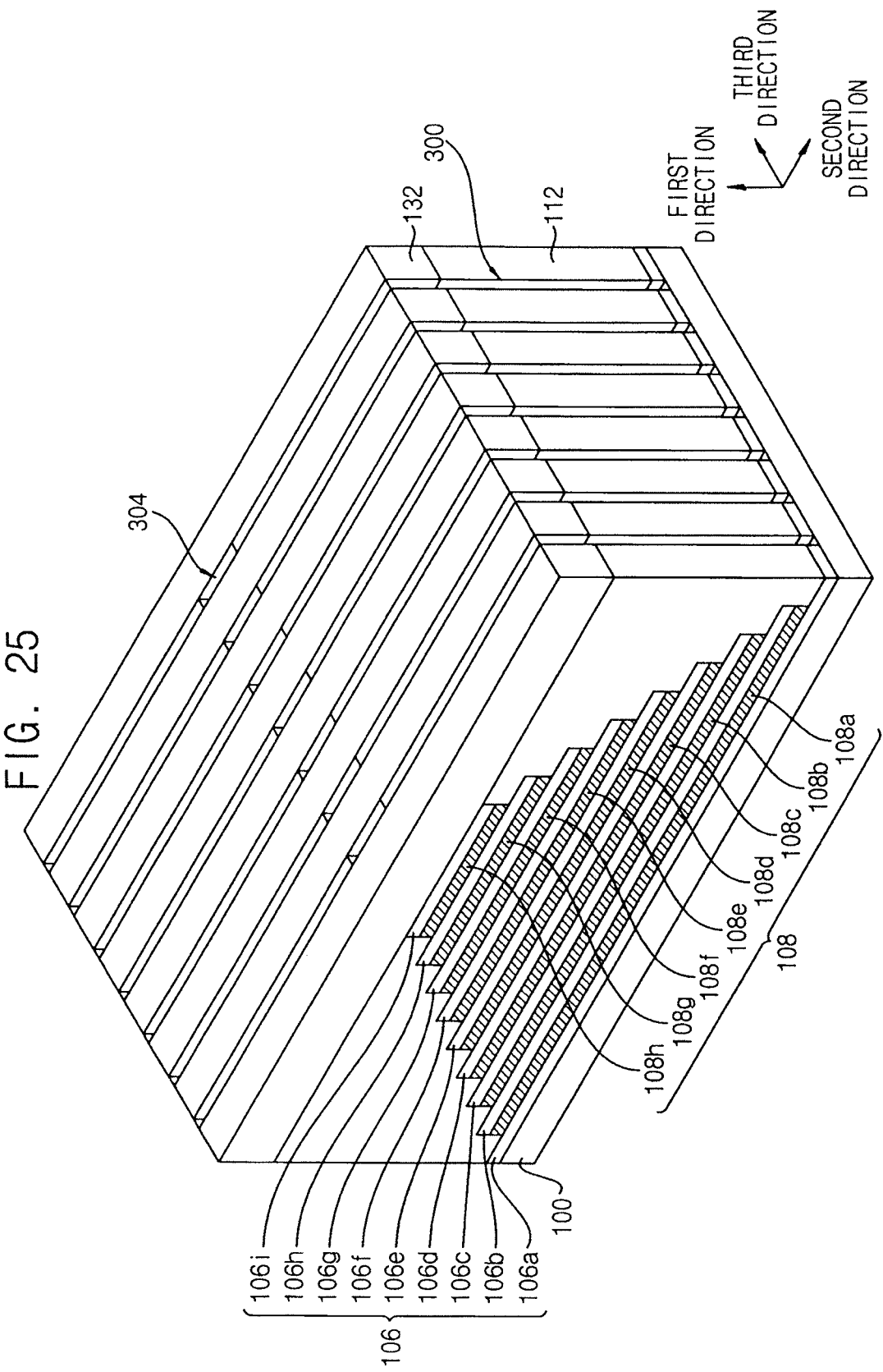
Figure 26:
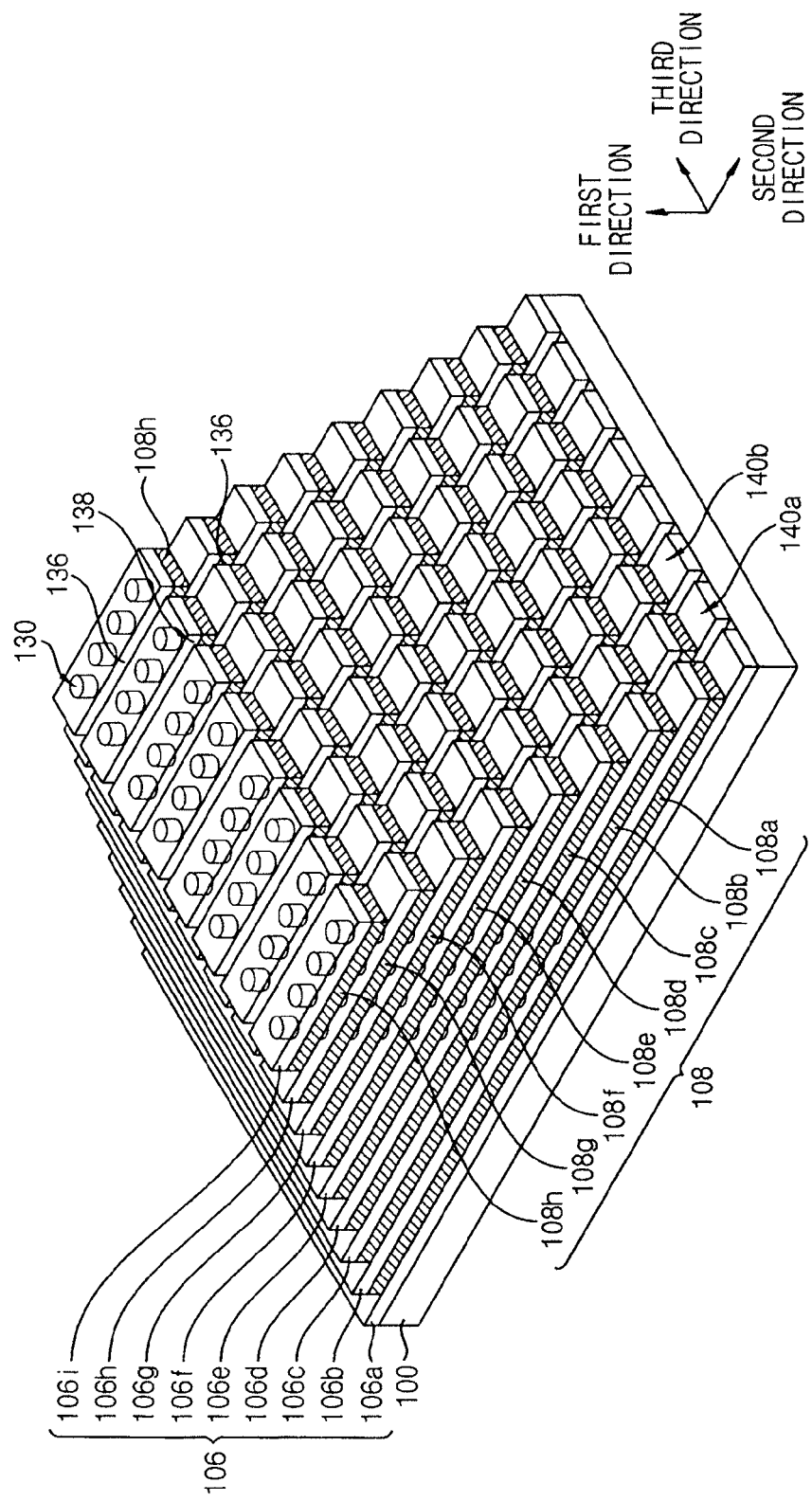

FIG. 25 illustrates a perspective view illustrating a portion to be etched by a second etching process to be explained hereinafter. FIG. 26 illustrates a perspective view illustrating a step pattern structure portion after performing the second etching process. Referring to FIGS. 25 and 26, an insulating layer sufficiently filling up the inner portion of the first hole 300 may be formed, and a planarizing process may be performed to expose the upper surface of the step pattern structure 110.

In the step pattern structure 110, a connecting pattern forming portion 302 in the uppermost layer for forming the SSL may be removed to fon a second hole 304. Through forming the second hole 304, the uppermost sacrificial layer patterns 108h for forming the SSL may have a separated shape from each other.

Then, the same subsequent processes as explained referring to FIGS. 15 to 17 may be performed to form the vertical type semiconductor device illustrated in FIG. 21.

As described above, the word lines at each layer may be connected by the connecting pattern by the cell block unit in the vertical type memory device in accordance with example embodiments. Thus, an additional wiring for connecting the word lines may not be necessary. Accordingly, the wiring included in the vertical type memory device may become simplified, and the vertical type memory device may be easily manufactured.

Figure 27:
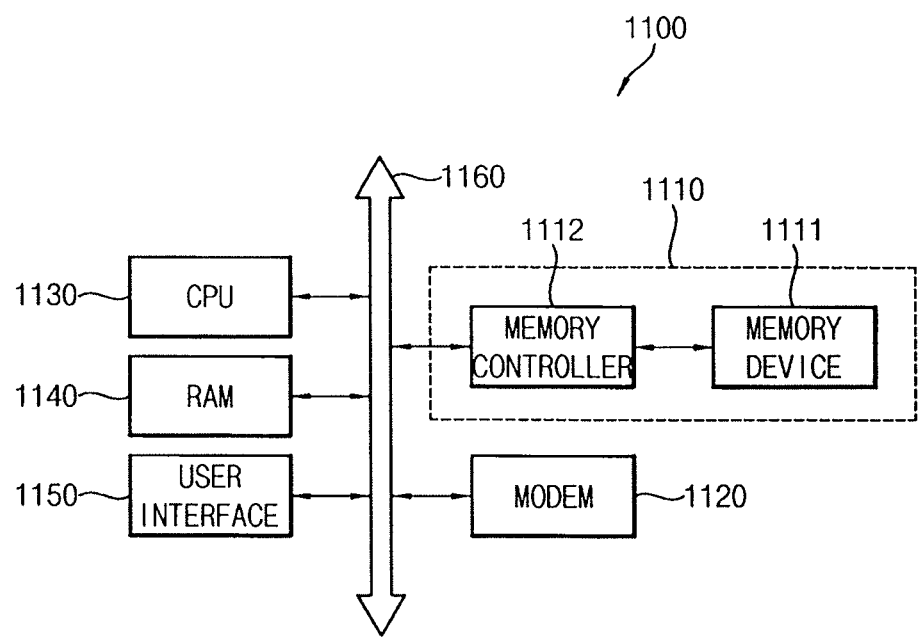
FIG. 27 illustrates an embodiment of an information processing system.

FIG. 27 illustrates an embodiment of an information processing system 1100 provided with a vertical type nonvolatile memory device 1111. The information processing system 1100 may include a memory system 1110, and a modem 1120, a central processing unit 1130, a ram 1140 and a user interface 1150, respectively making an electric connection to a system bus 1160.

In the memory system 1110, processed data by the central processing unit 1130 or externally input data may be stored. Since the memory system 1110 may include the vertical type nonvolatile memory device 1111 in accordance with example embodiments, the information processing system 1100 may stably store a large capacity of data.

Even though not illustrated, the information processing system 1100 in accordance with example embodiments may be further provided with an application chipset, a camera image processor (CIS), a mobile DRAM, or an input/output apparatuses.

One or more of the embodiments described may correspond to a vertical type nonvolatile memory device. Particularly, the vertical type nonvolatile memory device may be manufactured by a simplified process in accordance with example embodiments.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A vertical type semiconductor device, comprising:
a plurality of pillar structures extending in a first direction, the pillar structures including channel patterns and being arranged in a second direction and a third direction crossing the second direction;
a first word line structure surrounding the pillar structures, the first word line structure extending in the second direction and including first word lines, the first word lines being spaced apart from each other and stacked in the first direction;
a second word line structure surrounding the pillar structures, the second word line structure extending in the second direction and including second word lines, the second word lines being spaced apart from each other and stacked in the first direction, the second word line structure being disposed adjacent to the first word line structure in the third direction;
a plurality of connecting patterns to connect side walls of adjacent first and second word lines, the connecting patterns being electrically coupled with the first and second word lines positioned at a same level; and
a plurality of string select lines coupled to string select transistors on the first and second word line structures, each of the string select lines surrounding at least one pillar structure in the third direction and extending in the second direction, the string select lines separated from the first and second word line structures.

2. The device as claimed in claim 1, wherein:
the first and second word lines and the connecting patterns are positioned at the same level correspond to word line patterns, and
the word line pattern in one layer is connected with one contact plug and one connecting wiring electrically coupled to the contact plug.

3. The device as claimed in claim 2, wherein the word line patterns are arranged in a block unit and wherein the first and second word lines positioned in a block region of the block unit are electrically connected.

4. The device as claimed in claim 1, wherein the connecting patterns at each layer are arranged in the third direction.

5. The device as claimed in claim 1, further comprising a ground select transistor including a ground select line, wherein the ground select line is under the first and second word lines at a lowest layer.

6. The device as claimed in claim 1, wherein the first and second word lines extend to surround at least one pillar structure in the third direction.

7. The device as claimed in claim 1, wherein the first and second word lines are wider than the string select line.

8. The device as claimed in claim 1, wherein the first and second word lines have substantially a same line width as the string select line.

9. The device as claimed in claim 1, wherein the connecting pattern includes a same conductive material as the first and second word lines.

10. The device as claimed in claim 9, wherein the conductive material comprises a barrier metal material including a metal nitride and a metal material including tungsten.

11. The device as claimed in claim 1, wherein:
a portion of the string select line facing the connecting pattern in the first direction is wider than another portion of the string select line.

12. The device as claimed in claim 1, further comprising a plurality of stacked layer structures, wherein each stacked layer structure includes a tunnel insulating layer pattern, a charge storing layer pattern, and a blocking layer pattern arranged on a side wall of a corresponding one of the pillar structures.

13. A vertical type semiconductor device, comprising:
a plurality of pillar structures extending in a first direction, the pillar structures including a channel pattern and being arranged in a second direction and a third direction crossing the second direction;
a word line pattern including word lines and connecting patterns, the word lines surrounding the pillar structures, extending in the second direction, and being repeatedly arranged in parallel in the third direction, the connecting patterns connecting side walls of the word lines to electrically connect the word lines repeatedly arranged in parallel to each other in the third direction; and
a plurality of string select lines coupled to respective string select transistors, each of the string select lines extending in a second direction and provided higher than an uppermost word line pattern and surrounding one pillar structure in the third direction, the string select lines separated from the word line pattern.

14. The device as claimed in claim 13, wherein a plurality of the word line patterns are stacked and spaced apart from each other in the first direction.

15. The device as claimed in claim 14, wherein one word line pattern of one layer is provided with one contact plug and a connecting wiring electrically coupled to the contact plug.

16. A vertical type semiconductor device, comprising:
a first word line;
a second word line;
a connector to electrically connect the first word line and the second word line to form a word line pattern;
at least one string select line over the word line pattern; and
a number of pillars passing through the at least one string select line and the first and second word lines of the word line pattern, wherein the connector is substantially coplanar with the first and second word lines and is located at an area different from adjacent ends of the first and second word lines.

17. The device as claimed in claim 16, wherein at least two pillars pass through the first word line and at least two pillars pass through the second word line.

18. The device as claimed in claim 16, wherein the connector is to connect side walls of the first and second word lines.

19. The device as claimed in claim 16, further comprising:
a plurality of the word line patterns in a stacked arrangement,
wherein ends of the stacked word line patterns are stepped in a predetermined direction.

20. The device as claimed in claim 16, wherein widths of each of the first word line and the second word line are different from a width of the string select line.

* * * * *